United States Patent
Brukilacchio et al.

(10) Patent No.: US 11,868,049 B2
(45) Date of Patent: Jan. 9, 2024

(54) HIGH UNIFORMITY TELECENTRIC ILLUMINATOR

(71) Applicant: Innovations In Optics, Inc., Woburn, MA (US)

(72) Inventors: Thomas J. Brukilacchio, Reading, MA (US); David W. Pierce, Reading, MA (US)

(73) Assignee: Innovations in Optics, Inc., Woburn, MA (US)

( * ) Notice: Subject to any disclaimer, the term of this patent is extended or adjusted under 35 U.S.C. 154(b) by 0 days.

(21) Appl. No.: 17/718,476

(22) Filed: Apr. 12, 2022

(65) Prior Publication Data
US 2022/0334498 A1    Oct. 20, 2022

Related U.S. Application Data

(60) Provisional application No. 63/175,179, filed on Apr. 15, 2021, provisional application No. 63/174,798, filed on Apr. 14, 2021.

(51) Int. Cl.
*G03F 7/00* (2006.01)
*G02B 3/08* (2006.01)

(52) U.S. Cl.
CPC ........... *G03F 7/70075* (2013.01); *G02B 3/08* (2013.01); *G03F 7/7005* (2013.01); *G03F 7/7035* (2013.01); *G03F 7/70158* (2013.01)

(58) Field of Classification Search
CPC ............. G03F 7/70141; G03F 7/70158; G03F 7/7005; G03F 7/70166; G03F 7/7035;
(Continued)

(56) References Cited

U.S. PATENT DOCUMENTS

| 5,718,503 A * | 2/1998 | Kokubo | G02B 19/0028 |
| | | | 362/268 |
| 6,885,503 B2 * | 4/2005 | Yun | G02B 3/08 |
| | | | 359/569 |

(Continued)

FOREIGN PATENT DOCUMENTS

| DE | 4428188 C1 * | 11/1995 | ......... G02B 19/0014 |
| JP | 2009251194 A * | 10/2009 | |

(Continued)

OTHER PUBLICATIONS

English translation of JP 2009-251194, published Oct. 29, 2009. (Year: 2009).*

(Continued)

*Primary Examiner* — Christina A Riddle
(74) *Attorney, Agent, or Firm* — Schmeiser, Olsen & Watts LLP; William G. Guerin

(57) ABSTRACT

Described is a telecentric illuminator that can be used, for example, in a mask aligner system for semiconductor wafer processing or as part of a solar simulator system for characterization of solar cells. The telecentric illuminator includes a tapered optic, a lens group having a plurality of lenses and an aperture stop, and a hybrid Fresnel lens. The Fresnel lens is disposed at a position along the optical axis of the telecentric illuminator to generate a telecentric image of the aperture stop at an illumination plane. The Fresnel lens may have a curved central portion and the aperture stop may be apodized to achieve desired illumination characteristics and improve the resolution of a mask aligner system.

15 Claims, 14 Drawing Sheets

(58) Field of Classification Search
CPC .... G03F 7/70; G03F 7/70058; G03F 7/70066; G03F 7/70075; G03F 7/70091; G03F 7/7015; G03F 7/70175; G03F 7/70183; G03F 7/70191; G03F 7/702; G03F 7/70133; G02B 3/08; G02B 13/22
USPC ........ 355/18, 30, 52–55, 67–77; 219/121.73, 219/121.6; 356/317; 359/361, 565, 457, 359/558, 742; 396/432; 362/521
See application file for complete search history.

(56) References Cited

U.S. PATENT DOCUMENTS

| | | | |
|---|---|---|---|
| 7,186,004 B2 | 3/2007 | Powell et al. | |
| 8,403,527 B2 | 3/2013 | Brukilacchio | |
| 9,025,136 B2 | 5/2015 | Chen et al. | |
| 9,606,304 B2 | 3/2017 | Brukilacchio | |
| 9,971,135 B2 | 5/2018 | Brukilacchio | |
| 10,094,524 B2 | 10/2018 | Switzer et al. | |
| 2003/0142276 A1* | 7/2003 | English, Jr. | G02B 5/005 353/31 |
| 2004/0165165 A1* | 8/2004 | Yun | G03F 1/84 378/34 |
| 2006/0163223 A1* | 7/2006 | Zhang | B23K 26/082 219/121.73 |
| 2006/0194308 A1 | 8/2006 | Gutekunst et al. | |
| 2007/0009257 A1 | 1/2007 | Baldwin et al. | |
| 2007/0201148 A1* | 8/2007 | Eckhardt | G01J 1/0411 359/742 |
| 2009/0002669 A1 | 1/2009 | Liu et al. | |
| 2010/0283978 A1 | 11/2010 | Hawryluk | |
| 2014/0031665 A1 | 1/2014 | Pinto et al. | |
| 2015/0003061 A1* | 1/2015 | Brukilacchio | G01N 21/8806 362/237 |
| 2015/0064699 A1 | 3/2015 | Wietzorrek | |
| 2015/0226677 A1* | 8/2015 | Sullivan | G02B 21/002 356/237.5 |
| 2015/0229854 A1 | 8/2015 | Tofsted et al. | |
| 2015/0378215 A1* | 12/2015 | Tran | G02B 17/00 362/97.3 |
| 2016/0154193 A1* | 6/2016 | Brukilacchio | G02B 19/0066 385/33 |
| 2016/0350445 A1 | 12/2016 | Dowski et al. | |
| 2018/0252388 A1* | 9/2018 | Gommans | G02B 19/0061 |
| 2019/0146200 A1 | 5/2019 | Karlson et al. | |

FOREIGN PATENT DOCUMENTS

| | | | | |
|---|---|---|---|---|
| JP | 5172436 B2 | | 3/2013 | |
| JP | 2020106493 A | * | 7/2020 | |
| JP | 2020106493 A | | 7/2020 | |
| WO | WO-2011105461 A1 | * | 9/2011 | ........... G03F 7/7005 |

OTHER PUBLICATIONS

English translation of JP 2020-106493, published Jul. 9, 2020. (Year: 2020).*
English translation of WO2011/105461, published Sep. 1, 2011. (Year: 2011).*
English translation of DE4428188, published Nov. 2, 1995. (Year: 1995).*
International Search Report and Written Opinion in PCT/US2022/024339 dated Jul. 25, 2022.

* cited by examiner

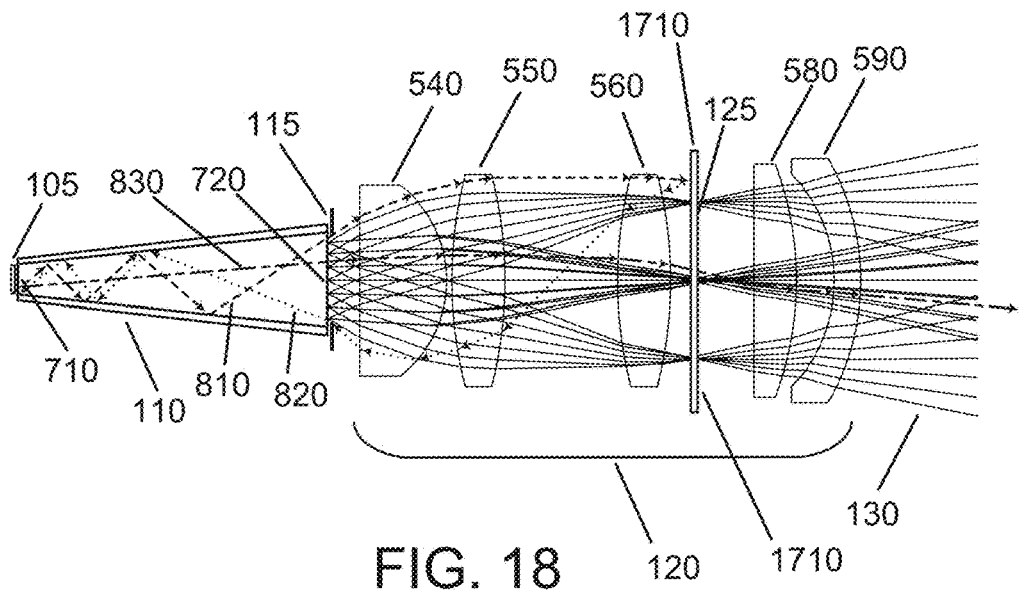
FIG. 18

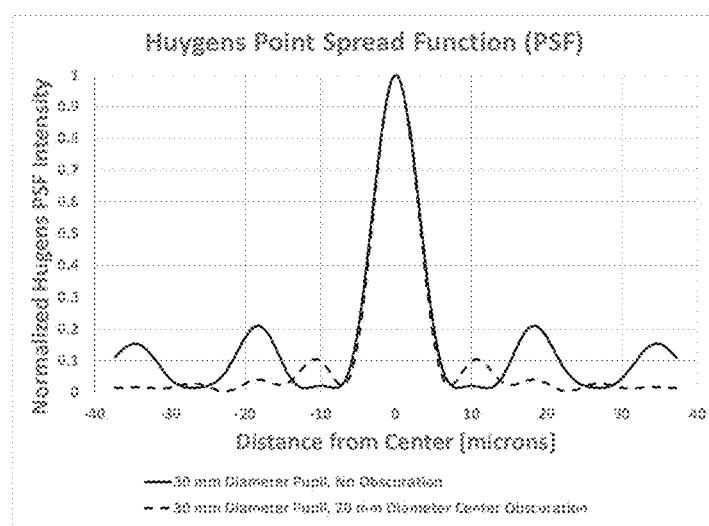
FIG. 19C

FIG. 19G

HIGH UNIFORMITY TELECENTRIC ILLUMINATOR

RELATED APPLICATIONS

This application claims the benefit of the earlier filing dates of U.S. Provisional Patent Application No. 63/174,798, filed Apr. 14, 2021 and titled "High Uniformity Telecentric Illuminator" and U.S. Provisional Patent Application No. 63/175,179, filed Apr. 15, 2021 and titled "High Uniformity Telecentric Illuminator," the entireties of which are incorporated by reference.

FIELD OF THE INVENTION

The disclosed technology relates to high radiance Light Emitting Diode (LED) ultraviolet (UV) and blue sources of telecentric illumination for selectively exposing photocurable materials through a mask placed in direct contact, or with a minor gap, in close proximity to a semiconductor wafer for selective mask-based patterning of devices. For example, such patterning may be used in the fabrication of integrated circuits and LED die. These UV and blue spectrum contact and proximity exposure illuminators are used in a class of semiconductor tools generally known as mask aligners. The disclosed technology also has application to solar simulators in which the LED sources where the LED die cover a broad spectrum of wavelengths including UV, Visible, and the near infrared (NIR).

BACKGROUND

LED light sources have only recently become available at performance levels suitable for challenging high intensity applications in contact and proximity exposure systems and solar simulators. The recent significant interest in replacing conventional mercury-based lamps and other non-solid state sources with LEDs is driven by many factors, including the significantly longer life, stable temporal output and wide variety of wavelengths available to tailor the spectrum of the illumination system more specifically to the absorption spectra of photoinitiators of relevant photoresists. Additional factors with respect to standard lamp technology include the reduced maintenance and down time, significant savings in operational costs, and higher intensities achievable with LED technology.

SUMMARY

Examples of the present disclosure include a telecentric illuminator. By way of examples, the telecentric illuminator can be provided as part of a mask aligner system for semiconductor wafer processing or part of a solar simulator system for characterization of solar cells.

In one example, a telecentric illuminator includes a tapered optic, a lens group and a Fresnel lens. The tapered optic has an input aperture to receive light from a light emitting diode source and has an exit aperture. The lens group is in optical communication with the exit aperture of the tapered optic and includes a plurality of lenses and an aperture stop and the Fresnel lens is in optical communication with the lens group. The tapered optic, lens group and Fresnel lens are arranged on an optical axis and the Fresnel lens is positioned on the optical axis to generate a telecentric image of the aperture stop at an illumination plane.

The Fresnel lens may include a curved central portion disposed about the optical axis and outer zones concentric with the optical axis. Each outer zone may include a facet surface. Alternatively, each outer zone may include a curved surface.

The Fresnel lens may be formed of a UV transmissive material.

The telecentric illuminator may further include a protective window adjacent to the Fresnel lens.

The telecentric illuminator may further include an LED source. The LED source may provide at least one of UV light and blue light. Alternatively, the LED source may provide light at wavelengths that include the UV, visible and NIR bands.

In another example, a telecentric illuminator includes a tapered optic, a lens group and a Fresnel lens. The tapered optic has an input aperture to receive light from a light emitting diode source and has an exit aperture. The lens group is in optical communication with the exit aperture of the tapered optic and includes a plurality of lenses and an apodized aperture stop and the Fresnel lens is in optical communication with the lens group. The tapered optic, lens group and Fresnel lens are arranged on an optical axis and the Fresnel lens is positioned on the optical axis to generate a telecentric image of the aperture stop at an illumination plane.

The Fresnel lens may be formed of a UV transmissive material and the apodized aperture stop may have a radially-varying reflectivity.

The apodized aperture stop may have a central reflective reaction and/or a reflective annular region. The central reflective region may have a non-circularly symmetric shape.

BRIEF DESCRIPTION OF THE DRAWINGS

The structure, operation, and methodology of the invention, together with other objects and advantages thereof, may best be understood by reading the following detailed description in connection with the drawings in which each part has an assigned numeral or label that identifies it wherever it appears in the various drawings and wherein:

FIG. 18 shows the components of FIG. 8 in which the reflective aperture with a central hole is replaced by a reflective apodized aperture stop.

FIGS. 19A to 19J show examples of apodized aperture stops that may be used in different examples of a telecentric illuminator.

DETAILED DESCRIPTION

A telecentric illuminator, as described in embodiments below, uses a three-way telecentric optical imaging system. The illuminator is telecentric in object and image space as well as at the aperture stop to enhance the intensity imaged from an LED array through a tapered non-imaging collection optic, a reflective field stop and a telecentric aperture stop which redirects light outside the dimensions of the stops back toward the LED die array and which is diffusely reflected back through the field and aperture stops to a hybrid Fresnel lens to produce low divergence, telecentric, uniform illumination at the plane of a mask in contact with or close proximity to a photoresist-covered semiconductor wafer for the purpose of etching sharply resolved circuit element features. The system may alternatively be used as a solar simulator that provides uniform simulated solar illumination for characterization of solar cells.

Figure 1:
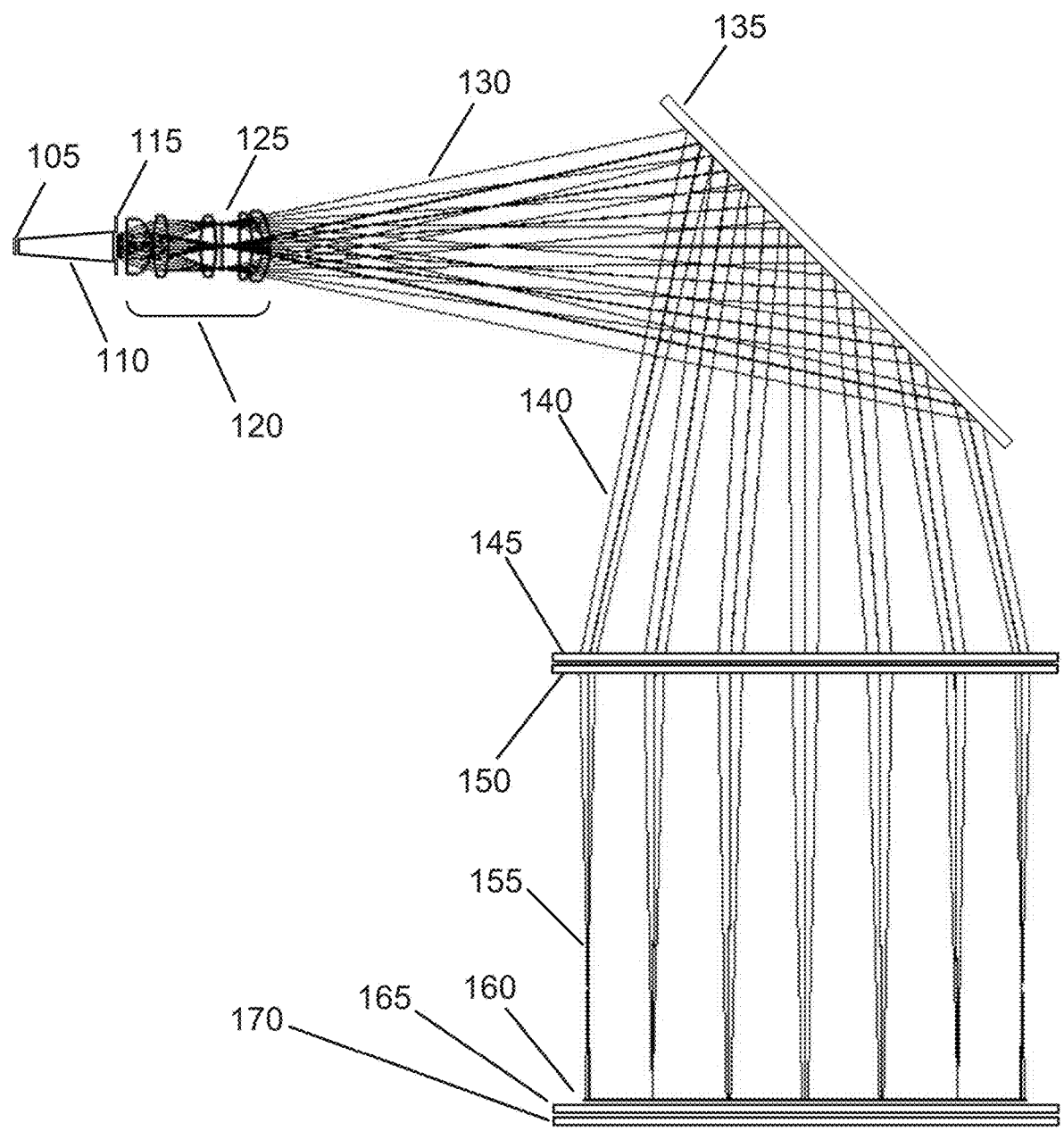
FIG. 1 shows a diagrammatic cross-sectional view of an example of a telecentric illuminator that provides highly uniform illumination.

Referring to FIG. 1, a diagrammatic, cross-sectional view of an embodiment of a high uniformity telecentric illuminator is shown. The illuminator comprises an LED die or die array 105, a tapered non-imaging collection and intensity homogenizing element (referred to herein as "tapered optic") 110, and a reflective field stop 115. The output of the tapered optic 110 is immediately incident on the reflective field stop 115. The illuminator further comprises a group of imaging lenses (lens group 120) having an aperture stop 125 and a high reflectivity turning mirror 135 to redirect the optical axis and direct rays 130 downward (as rays 140) to a hybrid Fresnel lens 145 having a central curved lens section, resulting in telecentric rays 155 that pass through a protective window 150 which protects the surface features of the hybrid Fresnel lens 145. The rays 155 form an image 160 of the output of the field stop 115. The resulting high uniformity telecentric illumination with a narrow far field angular extent, is incident on a mask 165. Light that passes through the mask 165 exposes a photocurable photoresist on a semiconductor wafer 170 for the purpose of etching a pattern on the wafer 170. When the LED die or die array 105 provides UVA and/or blue light, the system configuration is generally referred to as a UV contact or proximity exposure system such as used in semiconductor processing associated with wafer processing systems known as mask aligners. The telecentric arrangement results in UVA and blue light being incident at the mask 165 with the chief ray substantially normal to the plane of illumination over the entire image. The illumination is characterized by high intensity uniformity over the entire image area that enables a sharp, undistorted and well resolved illumination pattern on the photoresist and results in the ability to create small features with high positional accuracy relative to the mask 165. The system of FIG. 1 can be scaled to other sizes with a typical image size 160 of 200 mm to 300 mm to suit standard 8-inch and 12-inch semiconductor wafer fabrication lithographic etching requirements.

An alternative embodiment of the system utilizes LED die ranging in wavelengths that span the UVA, Visible, and NIR spectral bands, for example, as specified in IEC 60904-9. Such systems have applications as solar simulators which can be used to characterize, measure, and optimize solar cell photovoltaic performance. Advantageously, the angular subtense and optical spectrum of the incident light can be configured to closely match that of the sun and can meet or exceed the requirements for uniformity of intensity and spectral match to achieve class AAA standards for solar simulation.

Figure 2:
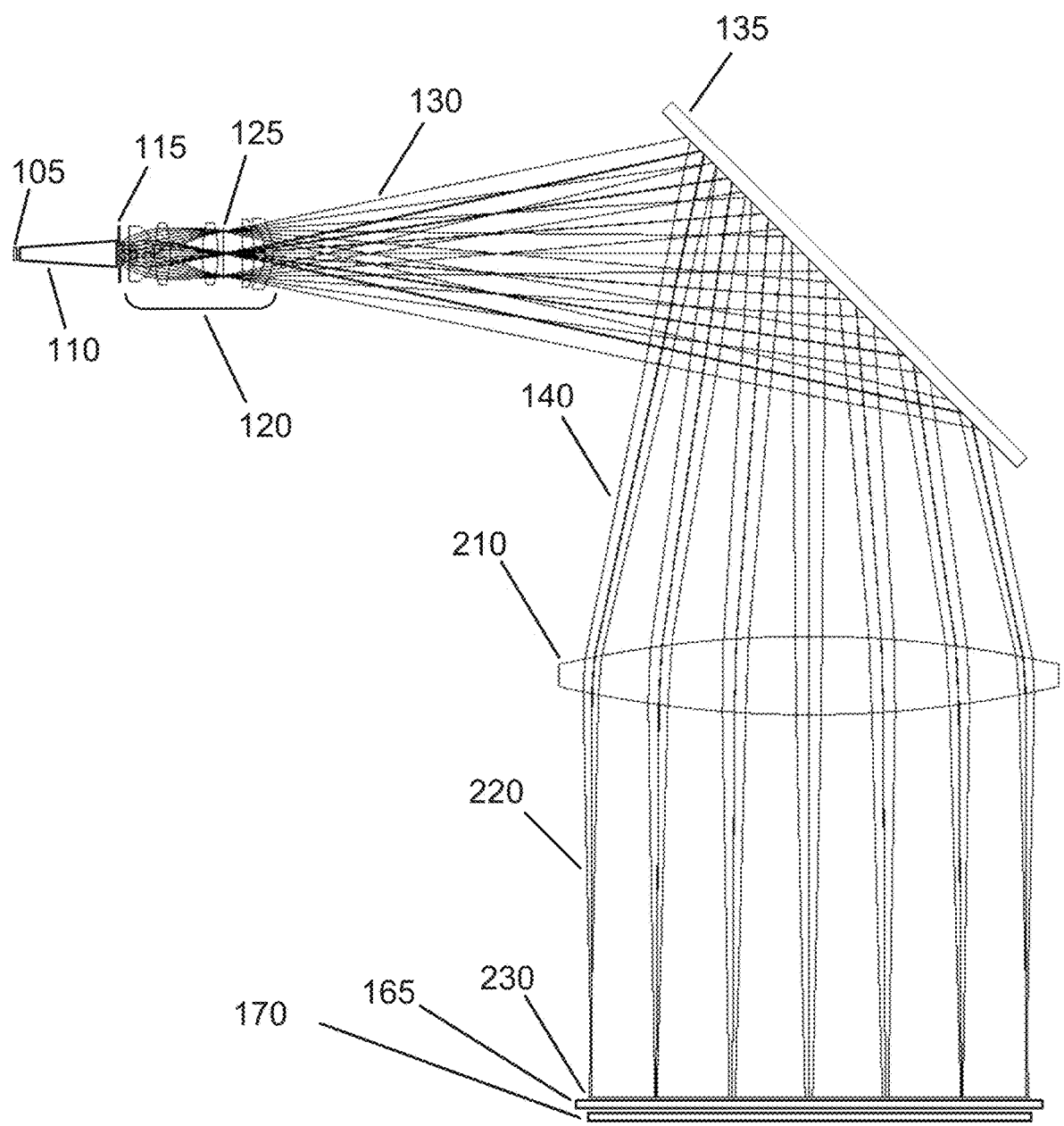
FIG. 2 is a diagrammatic cross-sectional view of the telecentric illuminator of FIG. 1 with the hybrid Fresnel lens replaced by a UV transparent glass lens.

An alternative embodiment of a telecentric illuminator is shown in diagrammatic cross-sectional view in FIG. 2 with the Fresnel lens 145 and window 150 of FIG. 1 replaced by a glass lens 210. Imaging rays 220 produce a telecentric image 230 incident on the mask 165 and semiconductor wafer 170.

Figure 3:
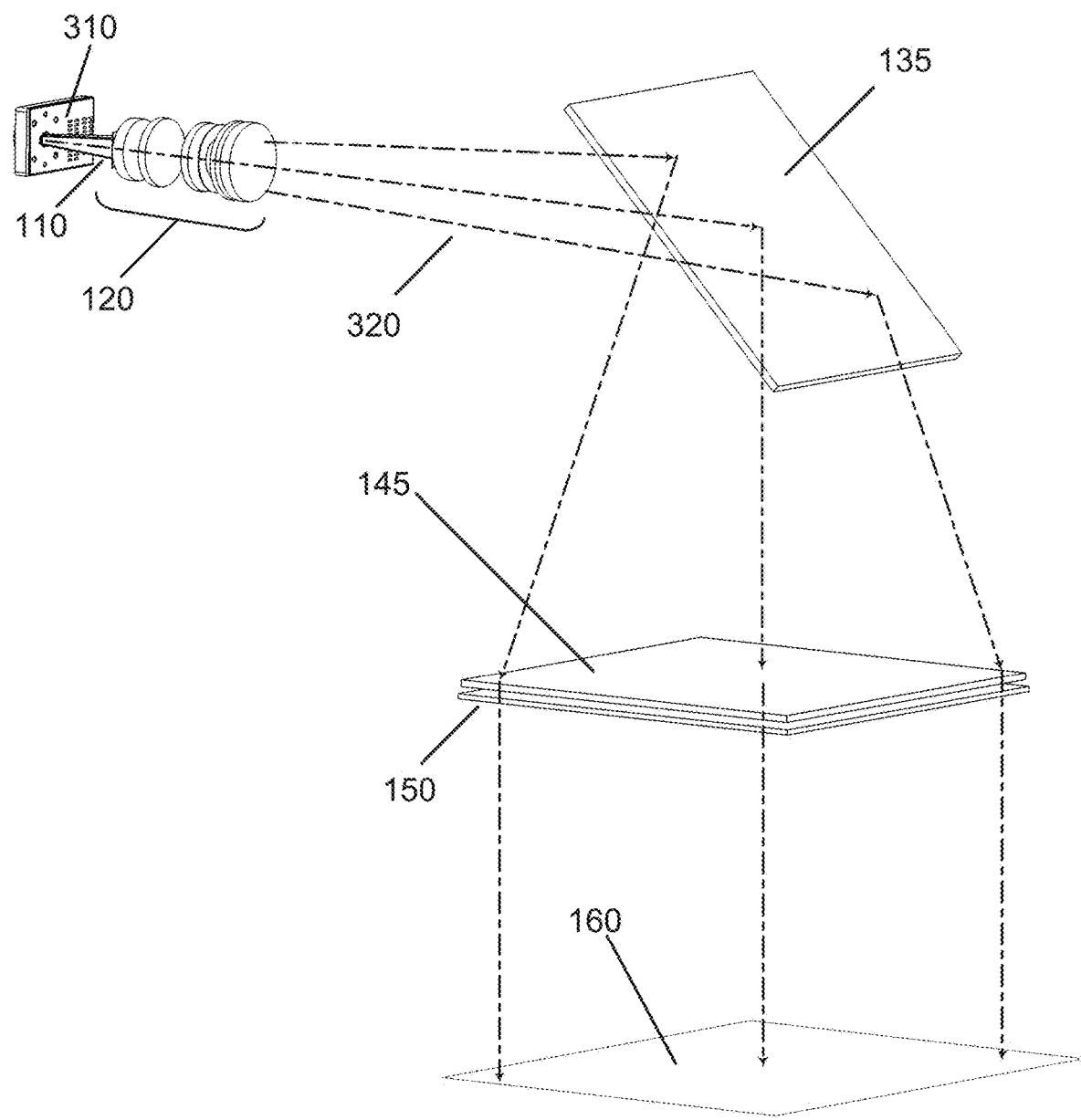
FIG. 3 is a diagrammatic isometric view of the telecentric illuminator of FIG. 1.

The system of FIG. 1 is shown in diagrammatic isometric view 300 in FIG. 3 with rays 320 mapped across a diagonal of the image 160. A metal core LED board 310 is shown to interface to the tapered non-imaging collection and homogenizing optic 110. Many system components (not illustrated) may be included in mask aligners and contribute to the vertical dimension of the systems. Such components may relate to alignment between the mask, illumination, and wafer as well as wafer handling and moving. Thus, there is significant motivation for the more compact optical system in the vertical dimension that results from inclusion of the turning mirror 135 which folds the optical path. In alternative embodiments, the turning mirror 135 is omitted such that the optical path is not folded. Preferably, the mirror 135 is made from a substantially flat glass or metal substrate with a high reflectivity interference coating designed for the appropriate nominal angle of incidence, in this case 45° to the normal. For example, reflectivity of 90% or greater can be achieved across the spectral range of interest. Although the mirror 135 can alternatively have curvature, any such optical power can introduce undesirable off-axis geometrical aberrations and distortion.

Figure 4:
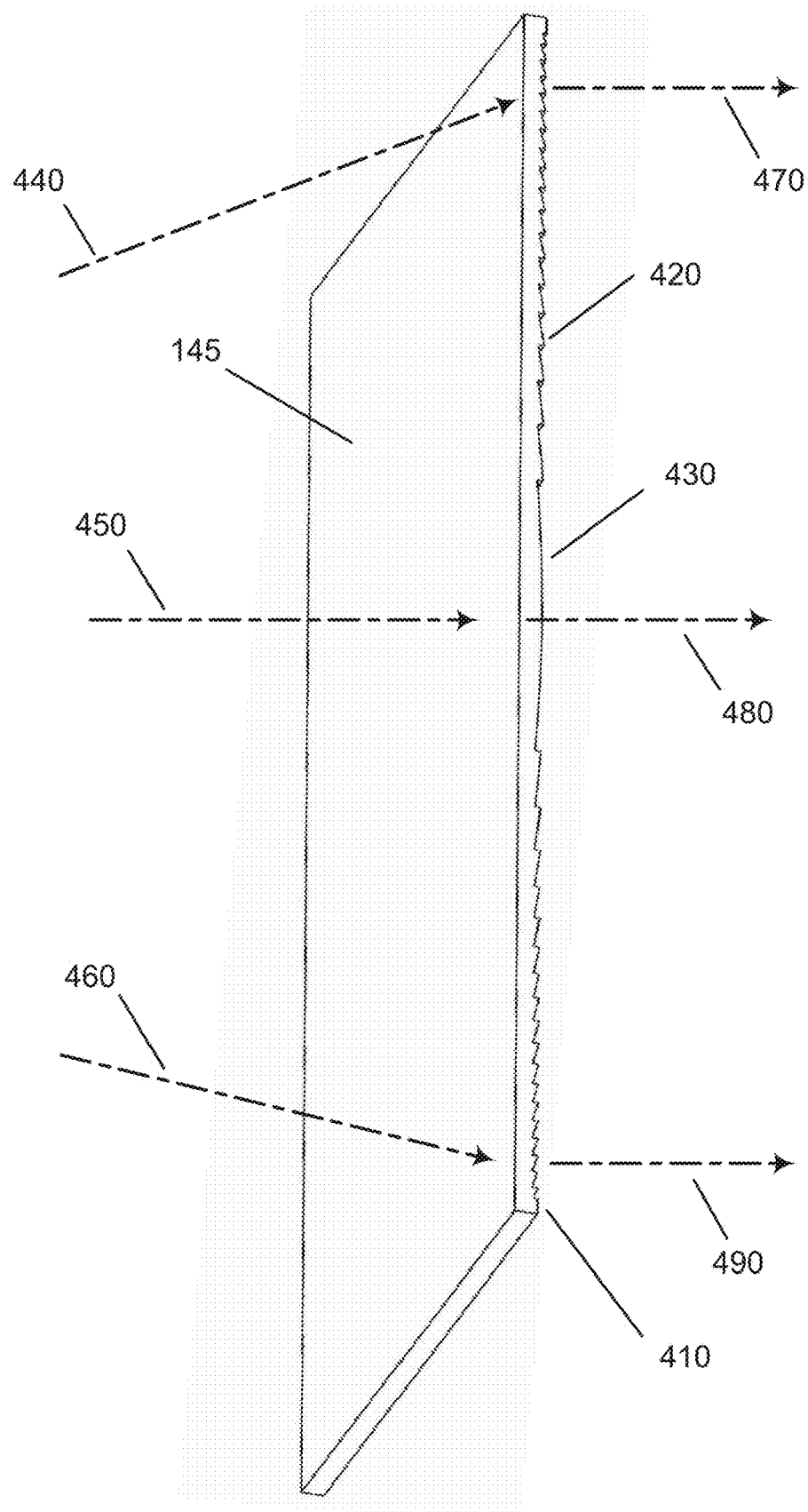
FIG. 4 shows a cut away isometric view of the hybrid Fresnel lens of the telecentric illuminator of FIG. 1.

A cross-sectional isometric view of the Fresnel lens 145 of FIGS. 1 and 3 is shown in FIG. 4. The lens 145 includes rotationally symmetric prismatic shaped groves, or facets, 420, typical of many Fresnel lens implementations, and a custom hybrid central zone 430 at the middle of the component. The angle of the prismatic facets 420 varies from the outer edge of the lens 145 toward the center and the width of each rotationally symmetric prismatic facet 420 increases with decreasing radius to optimally project the light with the chief rays normal to the illumination plane to achieve telecentricity. Preferably, the centermost zone 430 of the lens is characterized by a spherical or aspherical profile to improve image uniformity relative to a standard Fresnel lens having facets across the full lens aperture. Likewise, the facets 420 can be linear, spherical or aspherical. Standard optical plastics transparent to visible light, such as acrylic (PMMA), polystyrene, polycarbonates, or other similar optical polymers, do not transmit sufficient UV light and/or experience unacceptable solarization or degradation in transmission upon exposure to extended UV light. Specialized optical grade UV transparent and solarization resistant polymers, such as Acrylite H12 UVT Acrylic available from Roehm America LLC of Parsippany, N.J., can be used to overcome these limitations. The Acrylite H12 UVT Acrylic material was evaluated in an accelerated life test at high UVA flux centered near 365 nm and was determined to be suitable as a hybrid Fresnel lens material. Both front and back surfaces of the lens 145 are preferably antireflection (AR) coated to minimize Fresnel losses. A benefit of the of the hybrid Fresnel lens 145 is a significant reduction in system cost in comparison to the use of a standard lens such as lens 210 of FIG. 2 formed of a UV transparent and solarization resistant glass. Non-uniformity of less than 1% at the illumination plane can be achieved by the system of FIGS. 1 and 3.

FIG. 4 depicts rays 440, 450, and 460 incident at the first surface of hybrid Fresnel lens 145 which are redirected as rays 470, 480, and 490 respectively, toward the telecentric image 160 of FIGS. 1 and 3. Various fabrication methods can be used to manufacture the hybrid Fresnel lens in production including injection molding or compression molding techniques. Alternatively, the lens 145 can be molded or cast from UV transparent and substantially solarization free silicones or glasses. The high cost of a conventional glass lens is due in part to the cost of the material as well as the lens size. The large difference in thickness between the center and the edge of a conventional lens, such as lens 210 in FIG. 2, results in a gradient in transmission between the lens center and edge. This transmission gradient is due to the finite spectral absorption of the glass for all glasses in the shorter UVA region except for expensive glasses such as fused silica or i-line lithographic glasses for such a large substrate. The hybrid Fresnel lens 145, however, remains of relatively constant thickness over its full extent such that any finite absorption is nearly uniform. For example, the use of a high-quality standard glass such as Schott N-BK7 results in several percent lower transmission on axis versus the edge of the field due to finite spectral absorption differences resulting from the decreasing lens thickness with lens radius. Thus, if such materials were relatively solarization stable, their use would regardless result in unacceptable intensity nonuniformity at the illumination plane.

The features of the hybrid Fresnel lens 145 are shaped in a similar manner as the shape of the field stop 115, so that for a square field stop, the lens 145 is square in clear aperture; however, for a round field stop aperture 115, the clear aperture may be circular. Advantageously, the cost of the hybrid Fresnel lens 145 is more than an order of magnitude less than that of a conventional lens 210 (see FIG. 2), resulting in a significantly lower total system cost.

Figure 5:
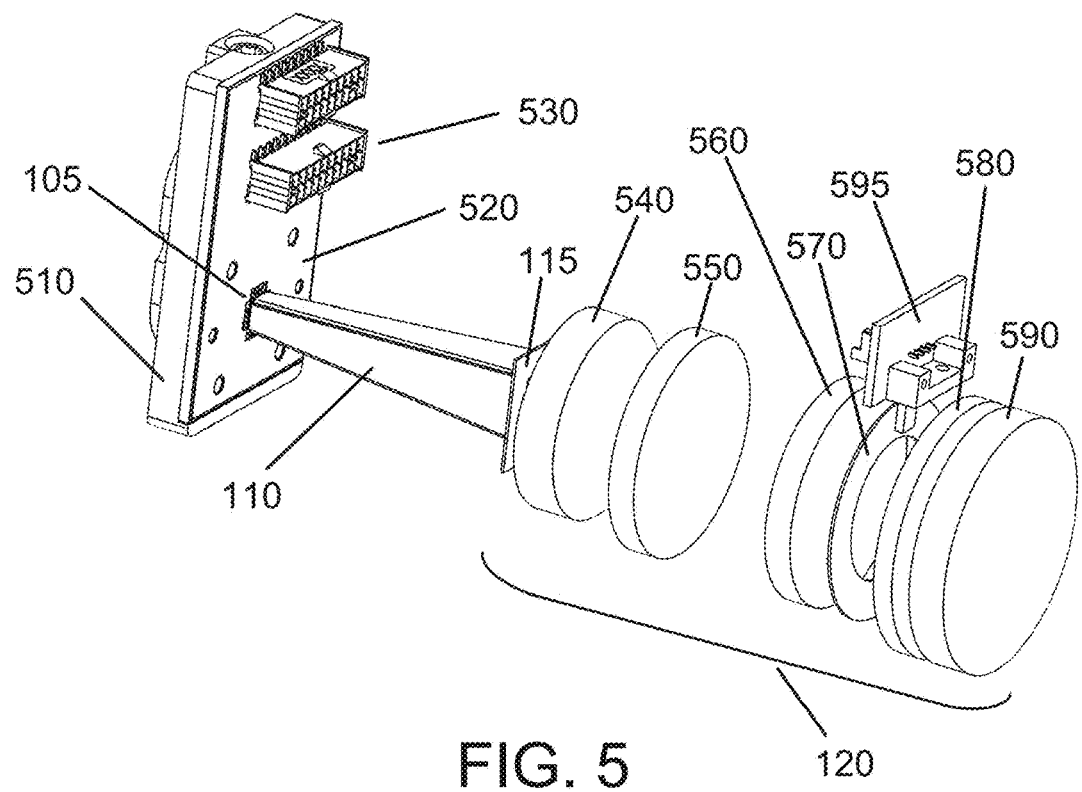
FIG. 5 shows a detailed diagrammatic isometric view detail of a portion of the telecentric illuminator of FIG. 3.

FIG. 5 shows a detailed view of the imaging lenses 120 of FIG. 2 with a liquid cooled manifold 510 attached to an LED chip on board (COB) metal core printed circuit board (PCB) 520 having a multi-pin electrical connector 530. The LED die or die array is attached to the PCB 520 and interfaces to the tapered optic 110. The end face of the tapered optic 110 is substantially in contact with the reflective field stop 115 at the upstream side of the lens group 120. The PCB 520 is made of a high thermal conductivity material, such as copper, and is attached on the back side to the liquid cooling manifold 510 and on the front side to the LED die or die array 105 with no intermediate thermal impedance other than the material used to attach to the LED die or die array 105. In a preferred embodiment, the LED die or die array 105 is attached directly to the copper metal core PCB by means of high conductivity solder, eutectic attached or by means of a low thermal impedance adhesive such as those comprising sintered silver materials or low thermal impedance preforms. In one preferred embodiment having a multiple LED die array, the LED die are positioned with minimal space between adjacent LED die to maximize the Etendue (area, solid angle, index squared product) since the optics of such systems are fundamentally limited in intensity by the source Etendue. In another preferred embodiment, explained in further detail below, the LED die of a die array are independently driven with one current source per LED die to maximize optical power and lifetime. This provides an advantage relative to parallel electrically driven LED die that are adversely affected due to variations in electrical die impedance which leads to uneven distribution of current and the potential for thermal runaway and catastrophic die failure at the high current densities required to achieve optimal performance. For example, a preferred embodiment of an 8-inch dimensioned image system can include a four-by-four array of LED die with a total of sixteen independent current sources. Each current source is capable of multiple amperes of current per die for typical square LED die on the order of 1.0 mm to 1.2 mm length per side. The liquid cooling manifold 510 can alternatively be replaced by a forced convection cooled heat sink and/or can include standard heat pipes or vapor chambers for improved heat spreading or thermoelectric Peltier type solid state coolers. The output of LED die increases with decreasing temperature so there is a benefit to cooling the LED die. The lifetime of LED die decrease by approximately a factor of two for a 10° C. increase in LED junction temperature, which can motivate the benefit of operating at lower junction temperatures. Further, to the extent that the mask aligner application for optical power is intermittent, the use of phase change materials can reduce the size of the cooler by averaging the heat dissipation over the off times.

With respect to the field stop 115 and tapered optic 110, any dust particles or imperfections in surface quality or AR coating can result in an artifact region degrading the illumination uniformity that would not properly cure a photoresist. Thus, there is a benefit in non-scanned systems, such as those disclosed herein, to using a hollow collection and homogenizing optic. It is feasible, however, if given sufficient care to use a solid tapered optic and windowed field stop as long as no artifacts are present on the surfaces.

As shown in the figure, lens group 120 is comprised of lens elements 540, 550, and 560 prior to reflective aperture stop 570 and lenses 580 and 590 following the aperture stop

570. The lens group 120 preferably comprises a high UV transparent glass such as UV grade fused silica optical glass or other solarization resistant glasses. For example, i-line glasses produced by companies such as Schott, are available for UV lithography systems used for semiconductor integrated circuit fabrication. The shape of the lenses can be optimized by those skilled in the art to produce the desired telecentric image at the illumination plane 160 of FIG. 2.

The purpose of the reflective field stop 115 is two-fold. Firstly, the field stop 115 acts to provide a sharp outline of the image conjugate to the illumination plane 160 by masking any gaps between the individual sides of the internally reflective surfaces of the four glass or metal sides of the tapered optic 110. Secondly, by overfilling the field stop 115 at the output of taper 110, the LED light incident on the internal mirrored LED-side surface of the field stop 115 is "recycled" to enhance the intensity at the illumination plane. This enhancement is a result of the diffusely reflecting LED light from outside the clear aperture of the field stop 115 reflecting backward so as to be incident at the LED die or die array 105. If a circular area of illumination is desired, a circular reflective field stop may be used instead of a square reflective field stop. The cross-sectional shape of the tapered optic is substantially square or rectangular to result in sufficient intensity homogenization, as a circular cross section results in poor near field spatial mixing and intensity uniformity. Therefore, the use of an inscribed circular field stop at position 115 acts to reflect and thus recover LED light that would otherwise be lost. Consequently, the intensity in the illumination plane may be increased by several percent or more by this recovery of LED light. In the case of a square field stop, overfill trades off efficiency for enhanced radiance at the output of the field stop 115. As the degree of overfill increases, the benefit relative to increase in LED power and thermal load decreases, so a tradeoff is required to determine the optimal degree of overfill according to system level intensity and electrical power requirements. Detector assembly 595 of FIGS. 5 and 6 samples the light that exits through a small hole in the aperture stop 570 and provides a means for monitoring intensity of the LED die or die array. The monitored light allows for closed loop intensity operation by means of modifying the current of the LED supplies by an amount that achieves substantially constant intensity at the illumination plane 160 over time.

Figure 6:
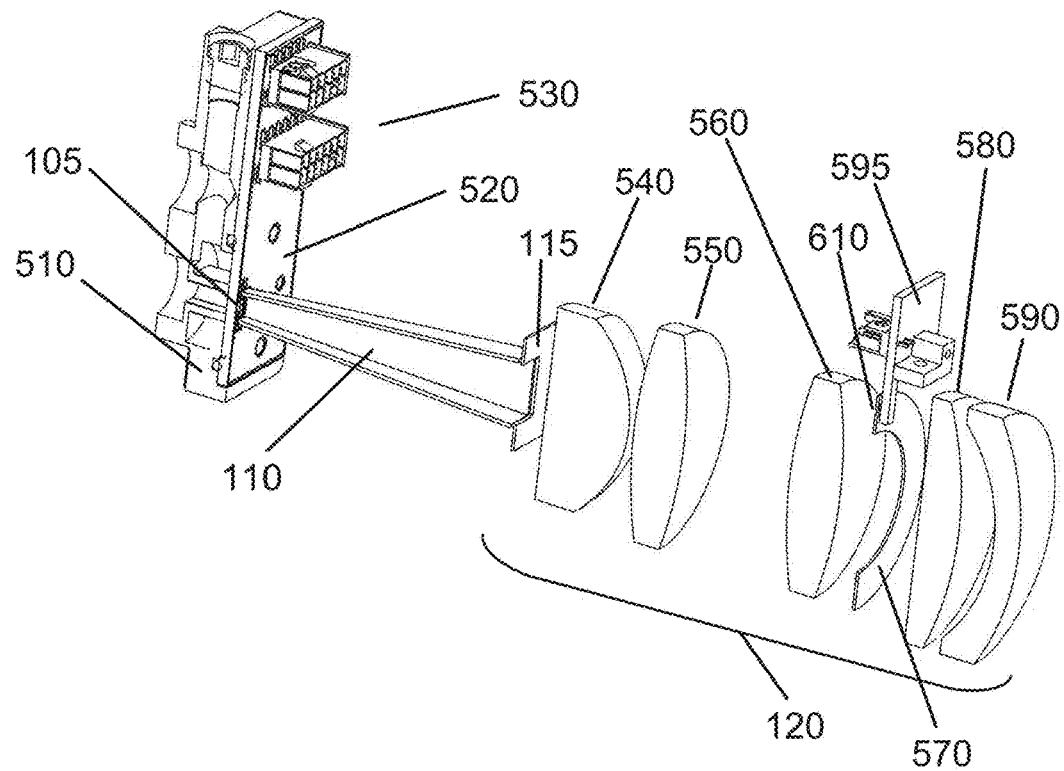
FIG. 6 shows a diagrammatic isometric section view of the components shown in FIG. 5.

FIG. 6 depicts a cross-sectional view of the system of FIG. 5. The figure shows the LED die array 105 at the input aperture of the tapered optic 110, which is shown as a hollow taper, and a cut through reflective aperture stop 570. The hole 610 in the reflective aperture stop 570, as described above, allows a photosensor on a detector board 595 to sample the light from the LED die 105 with substantially equivalent signal for all LED die positions since, as is known in the art, the output of every source is most uniformly distributed at the aperture stop 115 coincident with reflective aperture 570.

Figure 7:
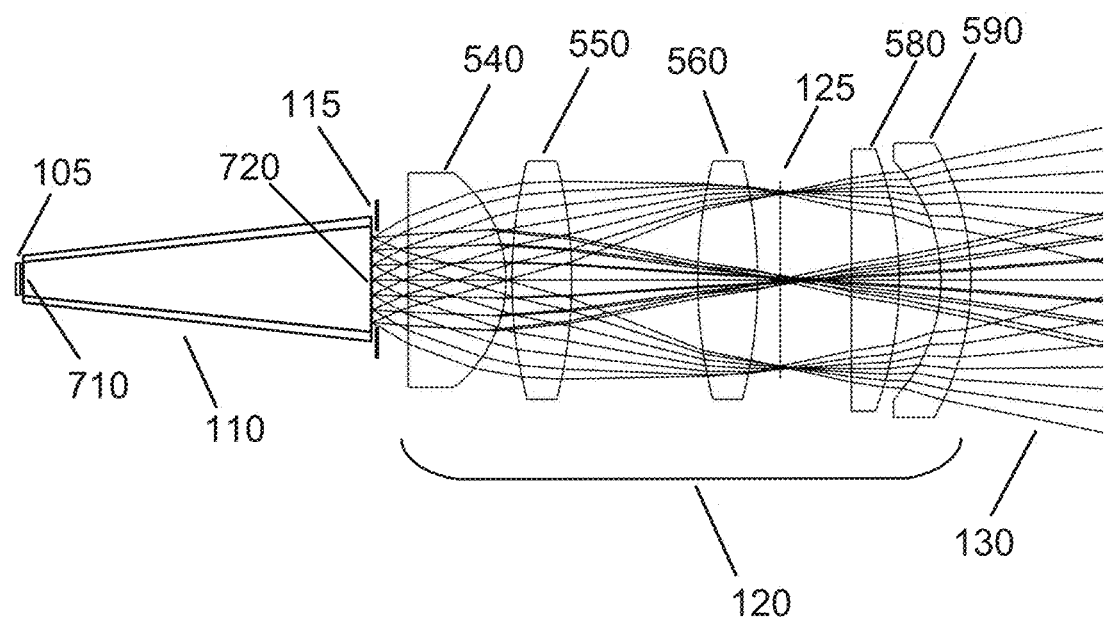
FIG. 7 shows a diagrammatic section view of the components of FIG. 5 without the reflective aperture stop and includes optical ray paths.

FIG. 7 shows a diagrammatic cross-sectional view of a portion of FIG. 1 from the LED die or die array 105 through the group of imaging lenses 120. The input aperture 710 of tapered optic 110 is coincident with the LED die or die array 105 and the output aperture 720 is at the opposite end of the tapered optic 110 and is substantially coincident with the field stop 115. The far field angle of the light exiting the tapered optic 110 at the output aperture 720 is determined by the ratio of the output aperture dimension to the input aperture dimension and the length of the tapered optic 110. The near field uniformity of the light exiting the tapered optic 110 increases with increasing length of the tapered optic 110 for non-uniform input intensity distributions. By way of examples, non-uniform input intensity distributions may result from LED die surface electrodes, wire bonds, LED die of different spectral content and die-to-die differences between different LED die in an array. A flat-sided tapered optic results in improved near-field spatial intensity distribution mixing in comparison with other approaches such as imaging directly by lenses or other non-imaging components such as compound parabolic concentrators (CPCs). For example, a CPC only produces a uniform intensity distribution in the near-field for a substantially uniform input intensity distribution which is not characteristic of standard LED die. The reflective field stop 115 in a preferred embodiment is made from a thin aluminum. For example, the reflective field stop 115 may be fabricated from highly reflective aluminum sheets available from Anomet Corporation of Brampton, Ontario, Canada having a reflectivity across the UVA spectral region of 90% or greater. In another example, a high reflectance broadband interference coating applied to a glass substrate to achieve a reflectivity of greater than 95% over the desired spectral range may be used. The preferred length of the tapered optic is determined by the system uniformity specification of the mask aligner system and is generally consistent with the relative dimensions shown in FIG. 7. It should be noted that the tapered optic 110 can be replaced by an optical fiber bundle or liquid light guide coupled to a square or hexagonal homogenizer; however, such components are generally less efficient and result in lower intensity at the plane of the mask.

Figure 8:
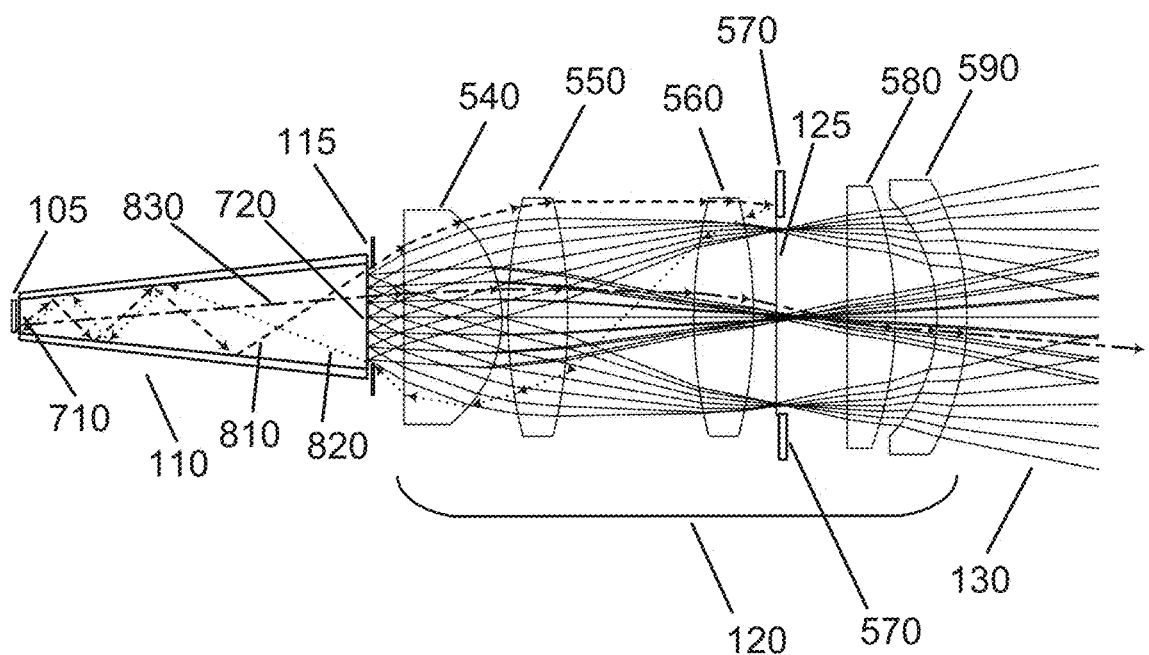
FIG. 8 shows the components of FIG. 7 and the reflective aperture stop and includes optical ray paths indicating recycling of the LED light.

With reference now to FIG. 8, the system of FIG. 7 is shown with ray 810 passing from the LED die or die array, reflecting off the top and bottom sides of hollow reflective taper 110, passing through the top edge of field stop 115, directed through lens elements 540, 550, and 560 and then reflected from the mirrored outer edge of aperture stop 570 along the ray path 820, returning to the LED array 105. The ray 810 then is diffusely reflected off the top of the LED die array, which has a diffuse reflectivity on the order of 50%, toward the output aperture 720 of taper 110 such that the ray 810 has a high probability of passing through the aperture stop 570 to the illumination plane 160, thereby enhancing intensity. By means of overfilling the Etendue of the system out of the tapered optic 110, incorporating reflective field stop 115 coupled with the recycling effects of reflective aperture 570, the intensity is enhanced above that which would be limited by strict Etendue matching. Thus, a high intensity, high uniformity, high radiant incidence illumination profile results at the mask 165 to produce a pattern on the photoresist covered semiconductor device 170. The region outside the clear aperture of the reflective aperture stop is illuminated and provides a location for the photosensor located proximal to the small hole 610 in the reflective aperture stop 570. An important aspect of the lens system is that the flux incident on the reflective aperture stop 570 is telecentric such that the flux is substantially propagated back toward the field stop aperture at an angular extent within the acceptance angle of the tapered optic 110 to allow the returned flux to traverse back to the LED array 105.

Figure 9:
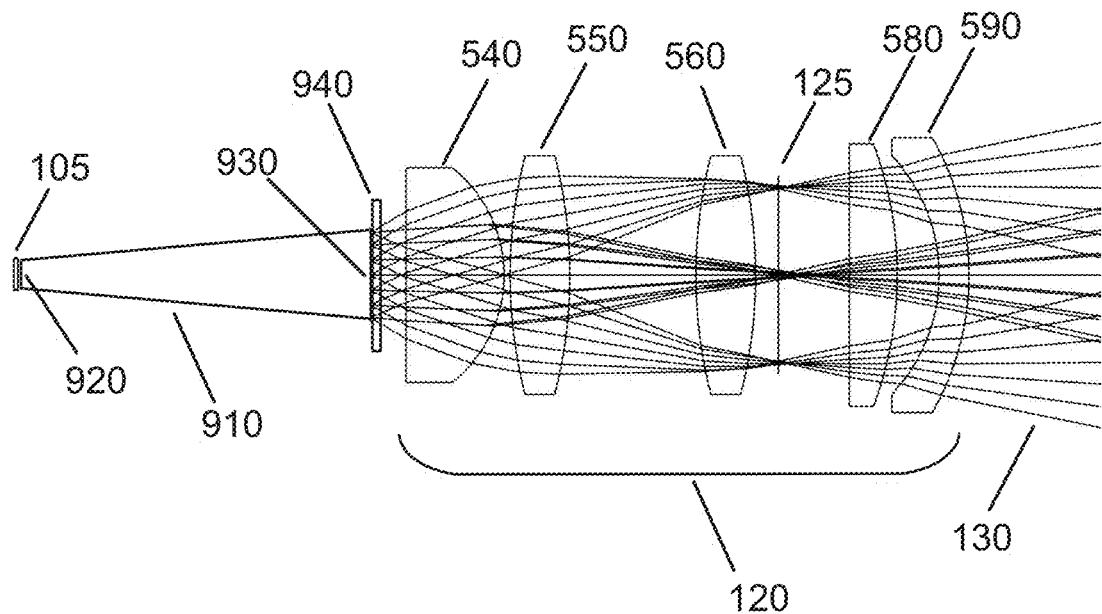
FIG. 9 shows an example of a tapered optic comprising a solid glass coupled to a window as an alternative to the hollow tapered optic shown in FIG. 7.

With reference now to the diagrammatic cross-sectional view shown in FIG. 9, the tapered optic 110 of the previous figures is replaced by a solid dielectric tapered optic 910 made of UV transmissive and solarization resistant materials. For example, materials such as fused silica or previously mentioned i-line glasses or other solarization resistant glasses or materials made from UV transparent silicones that are known to resist damage from high intensity UVA flux. It should be apparent to those skilled in the art that shorter wavelength UVB and UVC LED die can be incorporated as well to address surface cure issues due to oxygen inhibition (sometimes associated with legacy photoinitiators developed for use with mercury lamps) assuming transparent materials for the optics are used as well as AR and reflective coatings for the shorter spectral wavelengths. The LED die or die array 105 is adjacent to the solid dielectric tapered optic 910 at input face 920 and exits at output face 930. A window 940 is used at the output face 930 as a mechanical means to hold the solid dielectric tapered optic 930. It should be appreciated that a reflective field stop can be formed by coating the LED side of the window 940 to perform a similar function to that of the reflective field stop 115 of FIG. 7. The input face 920 is incident over a solid angle of a hemisphere exiting the Lambertian distribution exiting the LED die or die array. Thus, antireflection coatings would not be effective and result in a reflective Fresnel loss on the order of 8% to 10%. The multiple internal reflections; however, are substantially lossless in comparison to the reflectance losses of the inner sides of the hollow mirror coated tapered optic, somewhat making up for the difference. In particular, the longer the tapered optic, the more the transmission favors a solid tapered optic. However, for the same number of internal reflections and thus homogenization effect, the hollow tapered optic would be shorter due to the angular deviation resulting from Snell's Law of refraction in dielectric mediums for a solid dielectric tapered optic.

Figure 10:
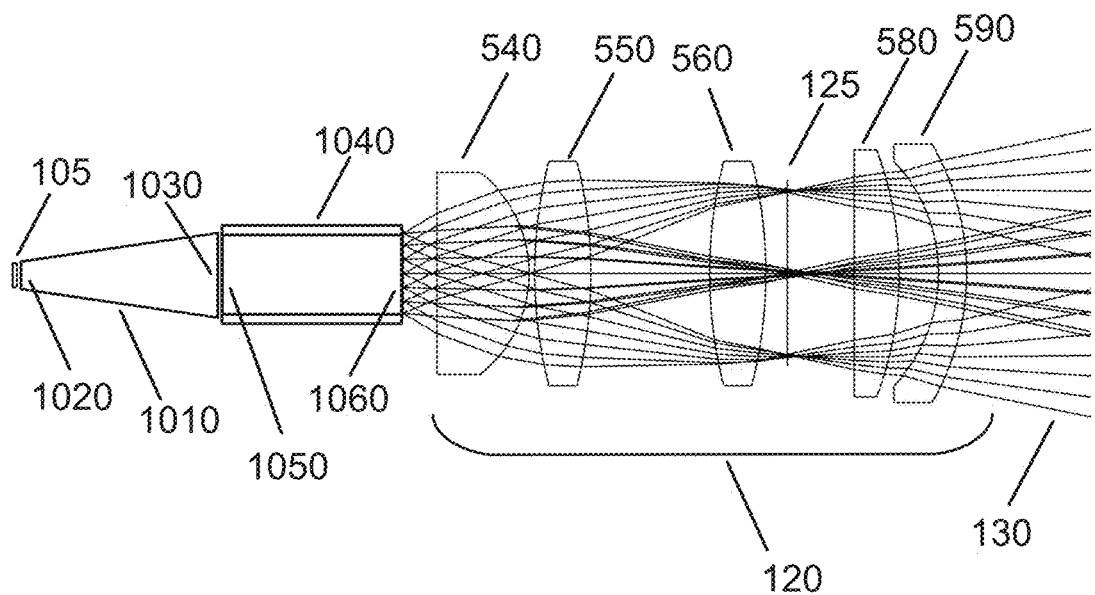
FIG. 10 shows an alternative example of a tapered optic and comprises a solid glass tapered optic element coupled to a straight-walled hollow element.

Referring now to FIG. 10, a diagrammatic cross-sectional view of a hybrid non-imaging collection optic is shown for which a first solid dielectric tapered optic 1010 with input aperture 1020 and output aperture 1030 is coupled to a second element comprising a straight walled hollow light pipe 1040 with input aperture 1050 and output aperture 1060 coupled to the lens group 120. It should be noted that a reflective field stop 115 can be located at the output aperture 1060 if desired for the previously stated purpose of enhancing the intensity at the image plane 160. The lengths of the dielectric tapered optic 1010 and straight walled hollowed light pipe 1040 can be optimized in length to give the best overall combination of uniformity, cost, and intensity. The input aperture 1050 of the hollow light pipe 1040 can be made smaller than the output of the dielectric tapered optic 1010 to hold the latter mechanically like the function of the window 940 of FIG. 9. It should be apparent that the walls of the hollow light pipe 1040 can be tapered at an angle. Alternatively, the hollow light pipe 1040 can instead be formed as a solid dielectric for which the flux is totally internally reflected instead of requiring a mirrored surface for the inner walls.

Figure 11:
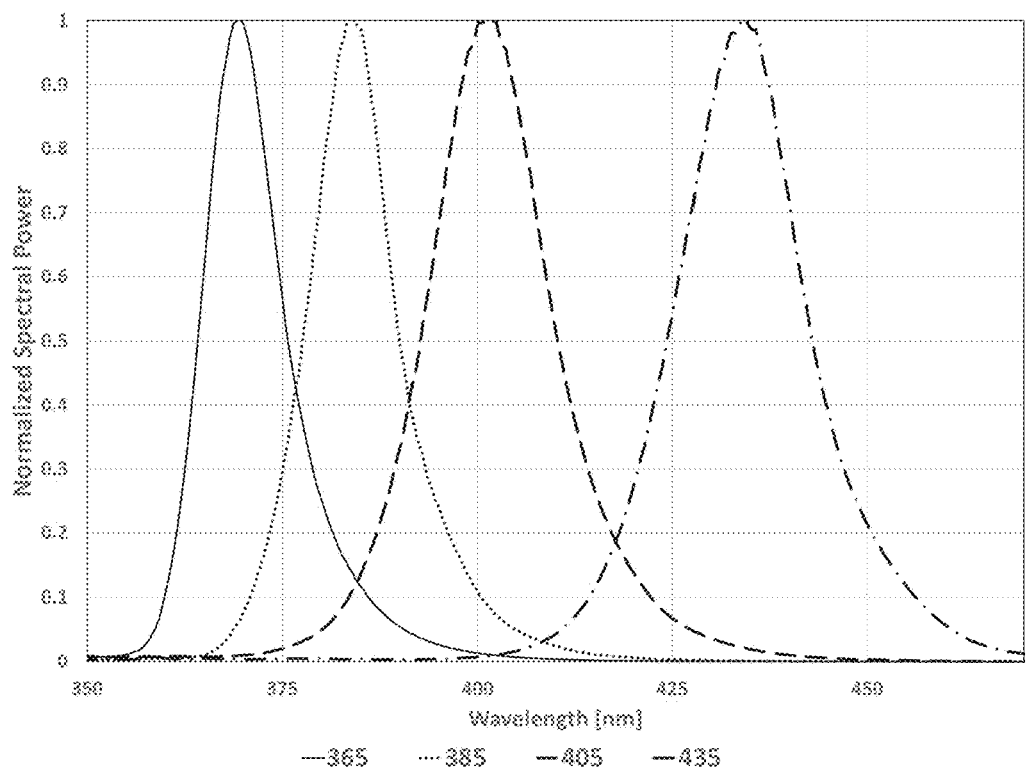
FIG. 11 shows a plot of normalized spectral power as a function of wavelength for representative UV and blue LED die that may be used in a UV contact exposure mask aligner system.

LED spectra applicable to the Mask Aligner applications are shown in the plots of FIG. 11. Any center wavelength in the UVA and Blue spectral range are applicable to the system of FIG. 1; however, for spectral beam combining purposes that are discussed in detail below, it is necessary to have minimal spectral overlap between LED spectra. Common center wavelengths for LED sources for Mask Aligner systems are centered near 365 nm, 405 nm and 435 nm, which are well aligned to the most widely used photoinitiator responses. The spectra for three wavelengths are shown to have small spectral overlaps between their respective emission spectra and as such are a good choice of wavelengths to be coupled employing dichroic beam combining methods.

Figure 12:
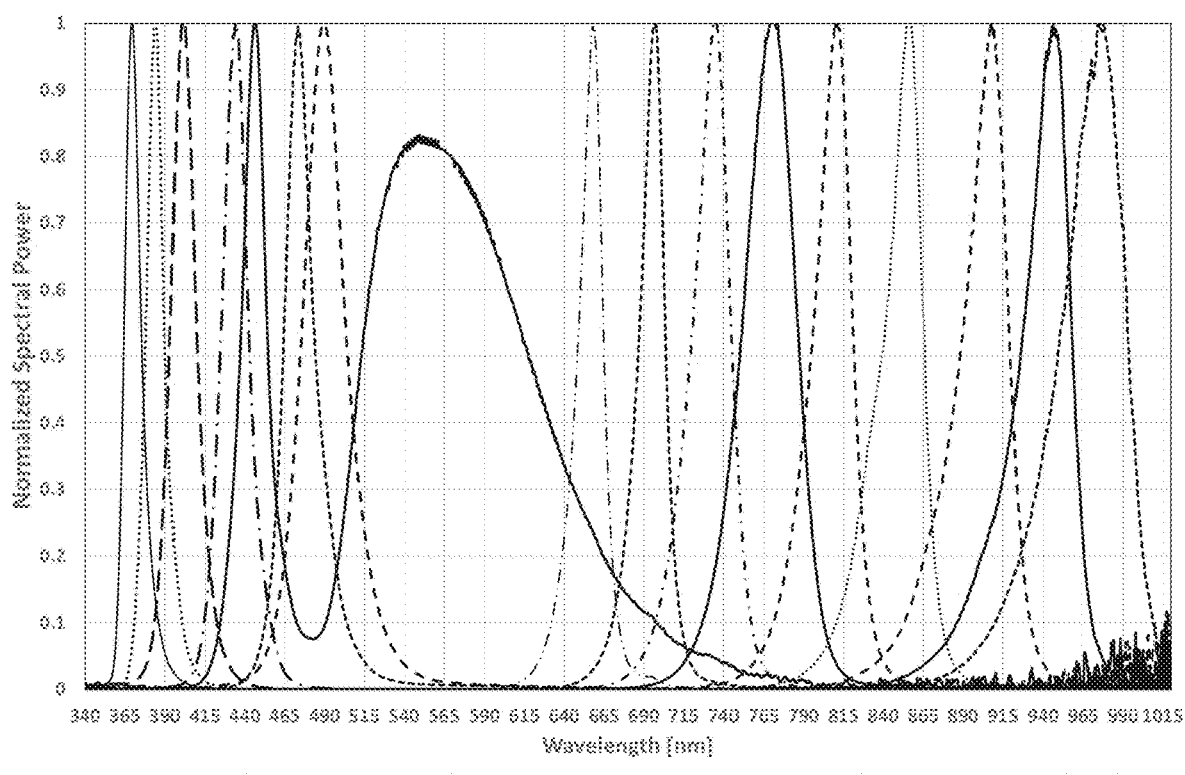
FIG. 12 shows a plot of normalized spectral power as a function of wavelength for LED die ranging in wavelength through UVA, Visible and NIR regions that may be used in embodiments of a telecentric illuminator for solar simulation.

With reference to FIG. 12, a spectral plot of normalized spectral output of LEDs in the range of UVA, visible, and the NIR are shown. The system of FIG. 1 fitted with an LED source array of similar wavelengths produces a high uniformity solar simulator system characterized by AAA performance given stable drive currents to the LED die. The optical materials are coated with broadband AR and mirror coatings to result in high transmission efficiency. In some instances, glasses having different ranges of refractive index and dispersion can be used to achieve performance over the broad range of wavelengths inherent with a Solar Simulator illumination system.

Figure 13:
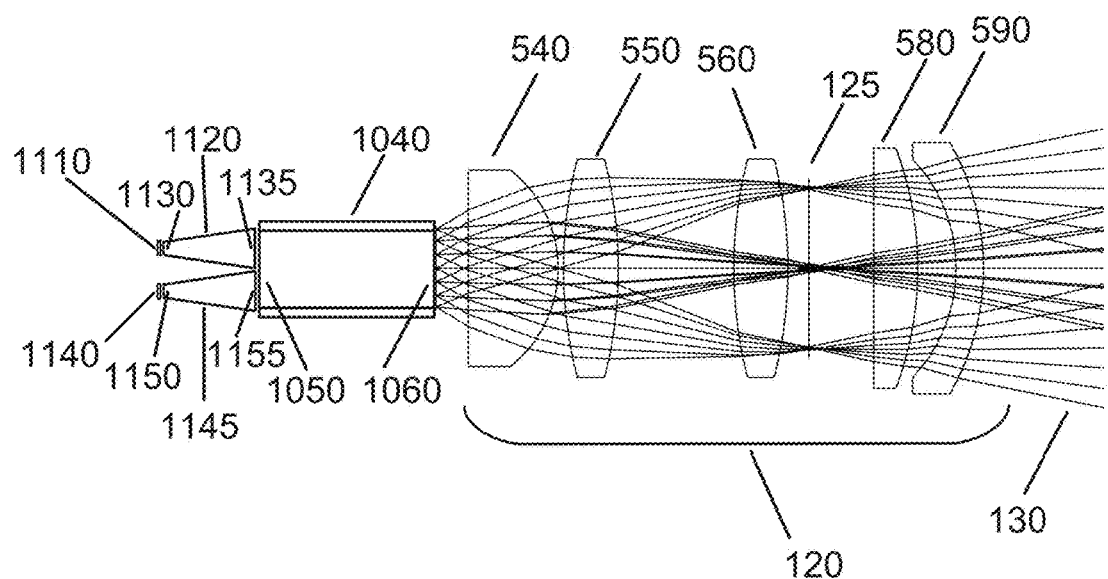
FIG. 13 shows a diagrammatic view of a portion of a telecentric illuminator in which the tapered optic section of FIG. 10 is replaced by a 2×2 array of half sized tapered optics as input to a common straight hollow light pipe.

FIG. 13 shows a diagrammatic cross-sectional view of an alternative embodiment to the collection optics shown in FIG. 10. In the illustrated embodiment, a two-by-two array of proportionally smaller LED die arrays (only two visible in figure) depicted by LED arrays 1110 and 1140 and associated dielectric tapered optics 1120 and 1145 (only two visible in figure) with input apertures 1130 and 1150, respectively, and output apertures 1135 and 1060, respectively, are used as inputs to the hollow light pipe homogenizer 1040. Alternatively, the array of tapered optics can instead include hollow tapered optics or the straight light pipe 1040 can have a solid dielectric construction. The advantage of the illustrated alternative embodiment is described below.

Figure 14A:
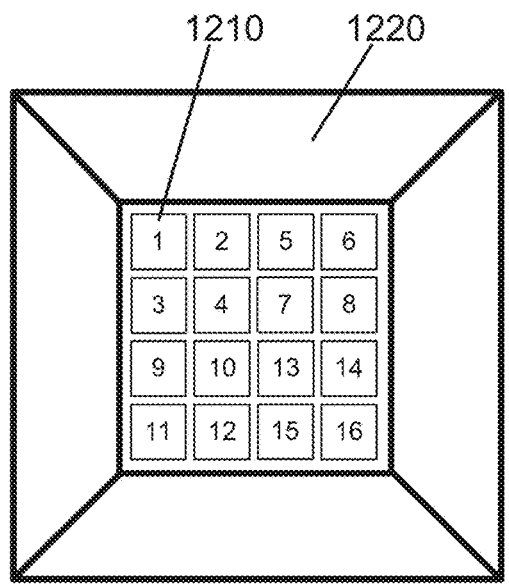
FIGS. 14A and 14B, show diagrammatic top views of the LED die array for a single tapered optic and a two-by-two array of tapered optics, respectively, for the telecentric illuminators according to FIGS. 10 and 13, respectively.
Figure 14B:
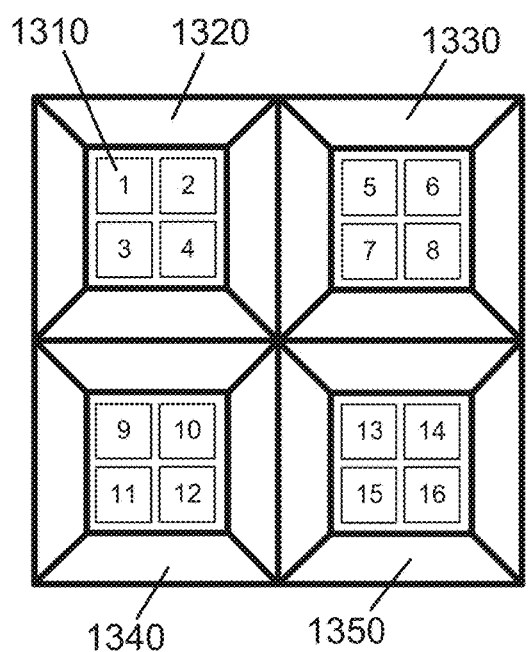

With reference now to FIGS. 14A and 14B, a top-down view is shown of the LED tapers and LED arrays of FIGS. 10 and 13, respectively. The total number of one-millimeter sized LED die is the same in both cases; however, the sixteen LED die of the four-by-four array 1210 of FIG. 14A coupled by tapered optic 1220, is replaced in FIG. 14B by four symmetrically positioned two-by-two arrays of LED die 1310 by tapered optics 1320, 1330, 1340, and 1350. Two advantages of the approach of FIG. 14B relative to that of FIG. 14A are achieved. First, a reduction in the overall length for the equivalent level of intensity homogenization is realized and second, the physical separation of the four LED die arrays 1310 results in improved thermal performance due to a reduction in the heating of LED die junctions from adjacent LED die. Thus, increased lifetime and/or intensity are possible, as related to reductions in LED efficiency with increasing LED die junction temperatures, which are well understood characteristics of LED die. Sixteen LED die with dimensions on the order of 1.0 to 1.2 mm on a side are consistent with Mask Aligners for exposure of eight-inch semiconductor wafers. This results in a far field angle of less than 3° at the illumination plane with industry leading intensity. Such small far field angles of illumination and high degree of telecentricity of less than one percent over the entire image achieve the necessary sharpness of the features to be imprinted on the semiconductor wafers of production Mask Aligner systems. The dimensions of the system can be increased in scale to the size required for twelve-inch semiconductor wafers that are increasingly present in high volume IC and LED die production fabrication facilities. The legacy mercury-based lamp systems for the twelve-inch wafer Mask Aligners are based primarily on 5 kW mercury lamps which have limited lifetime, are characterized by high cost of operation, require frequent calibration and result in significant down time for replacement of the short-lived mercury arc lamps, generate toxic ozone and heat that increases installation and maintenance cost substantially in comparison with systems based on the LED technology described herein. Another important attribute of embodiments described herein is the ability to mix multiple LED die wavelengths in one common aperture at the output of field stop 115 or the output of the tapered collection optic 1220 in the case of FIG. 14A or at the output of tapers 1320, 1330, 1340, and 1350 of FIG. 14B. The ability of the tapered optic to spatially mix the intensity in the near field is excellent; however, the more uniform the composite source is positioned at the entrance aperture of the tapered optic near the LED die array, the better the uniformity is at the output face for a multi-die, multi-wavelength configuration to cover a broader spectral range to allow for variations in absorption spectrum of various photoinitiators. For example, with reference to FIG. 14A, for the case of a three-wavelength system, such as 365 nm, 405 nm, and 435 nm all combined in one LED array, positioning the first wavelength LEDs, for example 365 nm die in positions 1, 4, 6, 11, 13, and 16, positioning 405 nm in positions 2, 7, 9, 12, and 14, and positioning 435 nm die in positions 3, 5, 8, 10, and 15 results in acceptable illumination plane non-uniformity for all wavelengths independently and collectively of better than 1.5% based on the standard metric of (max−min)/(max+min). If LED die were smaller and thus more LED die were used and uniformly distributed in a similar manner, better uniformity results. Likewise increasing the length of the tapered optic improves homogenization and further improves uniformity, if desired. If all the LED die of FIG. 14A operate at the same wavelengths, then the non-uniformity is less than 0.5% which is better than industry standards of 2% to 3% non-uniformity over the illumination plane. For the case of FIG. 14B which contains four distinct LED die arrays and tapered optics, the near field uniformity is best if each of the LED arrays includes all the LED die wavelengths. For example, die numbers 1, 4, 5, 8, 9, 12, 13 and 16 can be 365 nm die, die positions 3, 7, 11, and 15 can be 405 nm, and die positions 2, 6, 10, and 14 can be 435 nm. Note that in both cases, the number of 365 nm die is higher than those of 405 nm and 435 nm because state of the art UVA LED die optical power is lower for the shorter wavelength 365 nm die than that of 405 nm and 435 nm die, which are both approximately the same. Note that other configurations of LED die are also contemplated. Modeling with a non-sequential optical design program, such as ZEMAX®, can be used as a technique to determine the uniformity that would result from any given arrangement of LED die. The motivation for spectrally separating LED sources into physically separate die arrays is discussed below for which various spectral beam combining methods are presented which allow the intensity to be increased at the illumination plane by sharing the same common-path optics with different spectrums without increasing downstream system Etendue.

Figure 15:
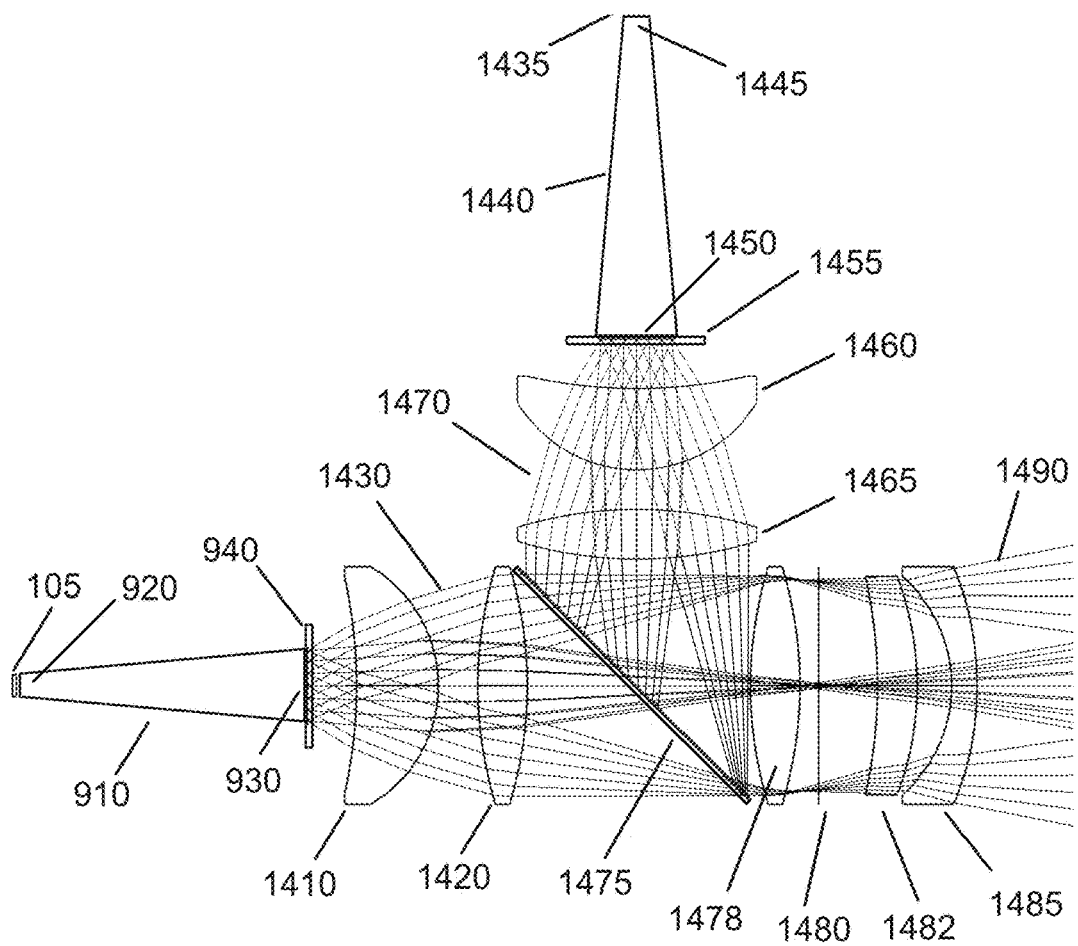
FIG. 15 shows a diagrammatic section view of a dichroic beam combining system used in another example of a telecentric illuminator.

Dichroic coupling of LED arrays of spectrally separated LED wavelengths, as indicated in the plot of FIG. 11, can be utilized in the system of FIG. 15 which is shown in a diagrammatic cross-sectional view. The system utilizes two-spectral bands which share a common optical path downstream from a spectral combining element 1475. Thus, the total optical power is increased without any increase in the Etendue and achieves the same narrow far field angle as the system of FIG. 1. A first tapered optic 910 couples the output of LED array 105 through first optical elements 1410 and 1420 toward and passing through dichroic beam splitter 1475 and then passing through common path lens 1478 to substantially telecentric aperture stop 1480 and then through the two additional first section of optical system lenses 1482 and 1485 before being transmitted to the common turning mirror and telecentric imaging lens of the system of FIG. 1. Light from a second LED array 1435, separated spectrally from the light of LED array 105, is collected by a second tapered optic 1440 having input aperture 1445 and output aperture 1450, held in place mechanically by window 1445 and coupled by first lenses 1460 and 1465 with the same optical prescriptions as lenses 1410 and 1420, respectively. The light output of lens 1465 reflects off the dichroic beam splitter 1475 through common path lens 1478, aperture stop 1480, lens 1482, and lens 1485 with rays 1490 projecting toward a turning mirror and telecentric imaging lens (not shown) similar to the system of FIG. 1.

Figure 16:
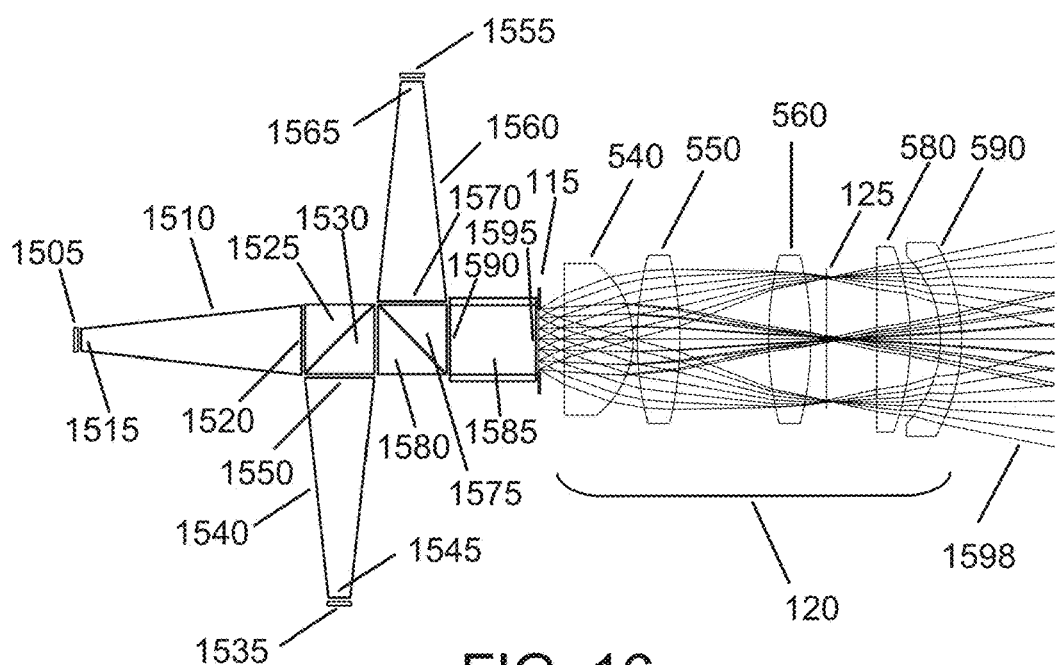
FIG. 16 shows a diagrammatic cross-sectional view of an alternative to the spectral beam combining system of FIG. 15.

Referring now to FIG. 16, a diagrammatic cross-sectional view of an Etendue preserving system comprising three dichroic combined LED arrays 1505, 1535, and 1555 by means of dielectric tapered optics is shown. Light from the LED die array 1505 is coupled into tapered optic 1510 having input aperture 1515 and exit aperture 1520, passes into right triangular glass element 1525. The light then passes through an air spaced right angle prism 1530 as the rays are totally internally reflected off outside walls of prisms 1525 and 1530, acting as a solid light pipe and continuing to be totally internally reflected off the side walls of right angle prisms 1580 and 1575 and into the input aperture of a common hollow light pipe 1585 having input aperture 1590 and output aperture 1595. The light propagates to reflective field stop 115 and is imaged by lens group 120. Likewise, light from LED array 1535 is collected by glass tapered optic 1540 having input aperture 1545 and exit aperture 1550, passes through the adjoining face of prism 1550, reflects off air spaced exit surface of prism 1530 by total internal reflection and then reflects off the dichroic coating on the hypotenuse of prism 1530. The reflected rays propagate along the system optical axis and totally internally reflect off the adjoining face between prism 1530 and output face of taper 1540 before continuing in a like through prism elements 1580 and 1575 by total internal reflection and subsequently into the hollow light pipe 1585. Similarly, LED array 1555 is collected by taper 1560 with input aperture 1565 and exit aperture 1570, through adjoining entrance face of prism 1575, totally internally reflecting off output face of prism 1575 adjoining entrance face 1590 of hollow light pipe 1585, subsequently reflecting off air spaced dichroic coated hypotenuse of prism 1575, and then totally internally reflecting off outside surface of entrance face of prism 1575 adjoining taper 1560 and then passing through entrance face 1590 of hollow light pipe 1585, now in common path with output of arrays 1505 and 1535. An advantage of this configuration is the compact size of the beam combing elements and the reduction of non-common optical path lenses as in the case of the beam combing system of FIG. 15. The coupled spectrums present in rays 1598 then pass to the turning mirror and telecentric imaging lens in a like manner to that shown in FIG. 1. Prism elements 1525, 1530, 1580, and 1575 are air spaced by the order of at least several microns to perform the dual function of dichroic beam combining and total internal reflection characteristic of a solid glass light pipe.

Figure 17:
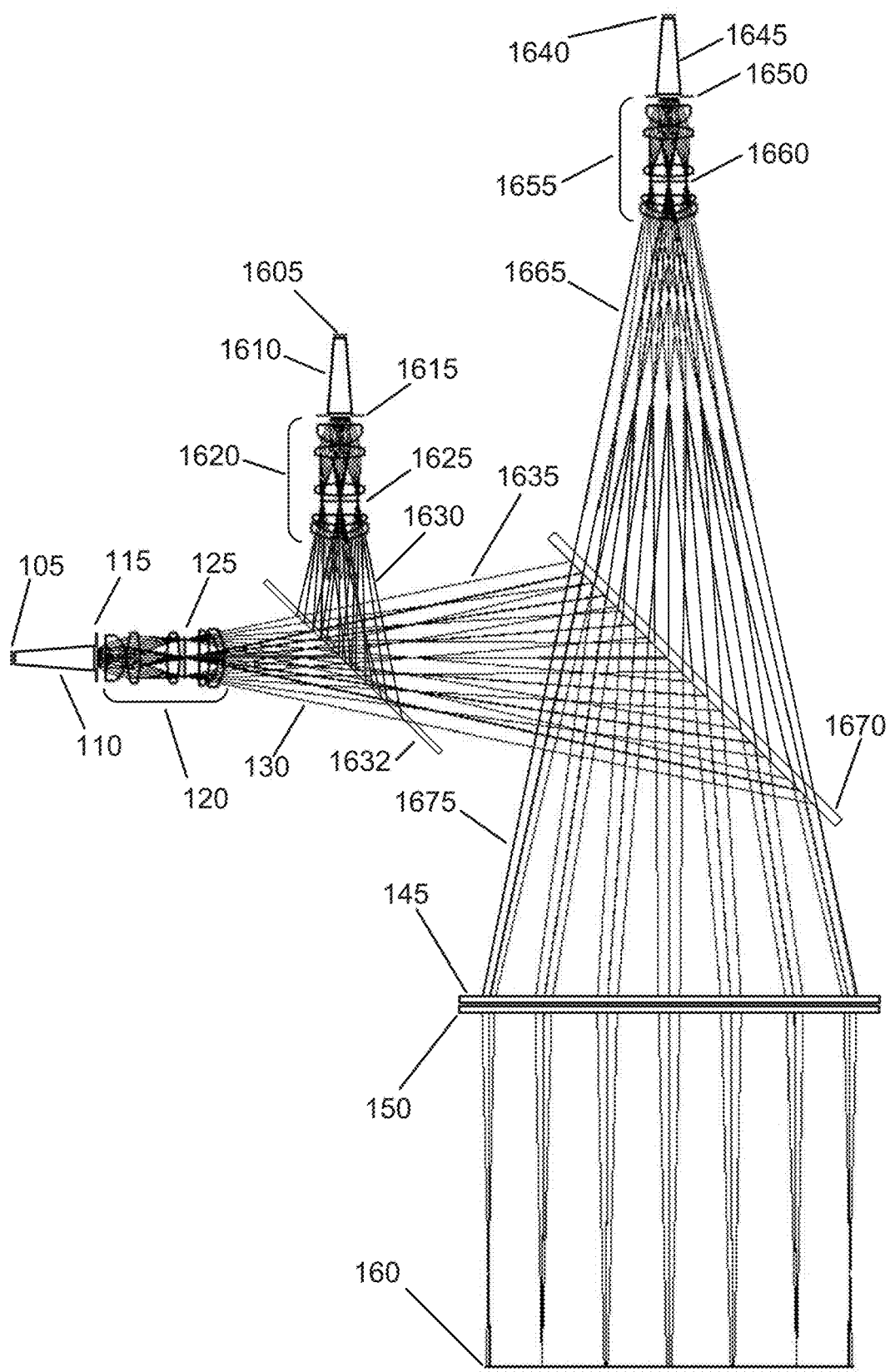
FIG. 17 shows a diagrammatic cross-sectional view of an alternative example to the spectral beam combining systems of FIGS. 15 and 16.

Referring now to FIG. 17, a diagrammatic cross-sectional view is shown of an alternative embodiment of a dichroic beam combining and Etendue conserving system of three spectrally separated LED die arrays 105, 1605, and 1640. In this embodiment, each of the LED die arrays has its own complete optical front end analogous to tapered optic 110, lens group 120 with exiting rays 130 of the system of FIG. 1. LED array 1605 is coupled into tapered optic 1610 and field stop 1615, subsequently propagates through lens system 1620 having aperture stop 1625 and emitted rays 1630, and then is reflected off and redirected by dichroic beam splitter 1632 along the common optical axis as that of LED array 105 and toward dichroic beam splitter 1670, subsequently reflecting downward toward hybrid Fresnel element 145 and imaged onto illumination plane 160. In a similar manner LED array 1640 is collected by tapered optic 1645 with field stop 1650, lens system 1655 through aperture stop 1660 with emitted rays 1665 subsequently transmitted through dichroic beam splitter 1670, thereby combined with the flux from dichroic LED arrays 105 and 1605. An advantage of this configuration is that the three LED array sources 105, 1605, and 1640 are coupled by means of standard dichroic beam splitters. A disadvantage of the configuration is more optical elements are used and the system size is larger. In general, the closer the spectrally separated LED array outputs are coupled to the arrays, the more compact and fewer elements that are required since the number of common path shared elements is increased in proportion to the total number of system components. The preferred configuration may be based on the complexity and cost of the mechanical components required to hold the optical elements.

Figure 19A:
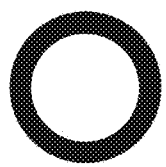
Figure 19B:
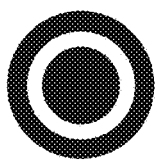

Referring now to FIG. 18, a diagrammatic cross-sectional view is shown of the system of FIG. 8 with the reflective aperture stop 570 replaced in FIG. 18 by a window reflective aperture stop 1710. The window reflective aperture stop 1710 allows for portions of the window reflective aperture stop 1710 to be selectively patterned by transparent regions, high reflective regions and/or partially transparent and partially reflective areas. For example, FIG. 19A shows a window reflective aperture stop effectively having the same functionality as the aperture stop 570 of FIG. 8 with a transparent aperture at the center surrounded by a reflective annular area indicated in black. In regions where the window reflective aperture stops are transparent, antireflection coatings are used to maximize transmitted throughput. The transparent back side of the window stop facing the illumination plane is antireflection coated in a preferred embodiment. Alternatively, FIG. 19B shows an apodized aperture stop for which the central diameter zone is reflectively coated in a similar manner as that of the window reflective aperture stop of FIG. 19A. This leaves only a transparent annular region for which emission from the LEDs is transmitted through the aperture stop. The diffraction pattern that results at the illumination plane 160 of FIG. 1 is thereby modified as indicated in FIG. 19C in which the rings of the resulting Airy Disk are suppressed as shown in the plot of the Huygens Point Spread Function (PSF) of the plot where intensity is plotted as a function of radial distance in microns from the center of the diffraction spot. Thus, by providing an apodized aperture stop by means of a window 1710, the resolution of the Mask Aligner optical system can be improved. The diffraction pattern at the imaged illumination plane is determined computationally as a Fast Fourier Transform (FFT) of the spatial frequency transmission function of the aperture stop. An apodized aperture stop can improve image plane resolution. For example, apodized aperture stops are often used in the field of astronomy to enhance the ability of a telescope to resolve two closely imaged stars. The net effect on resolution as applied to a Mask Aligner system is a function of the combined effects of diffraction and geometric and chromatic aberrations. Therefore, it is important to minimize chromatic effects and geometric aberrations such as spherical aberration, coma and astigmatism, particularly at off-axis points to the extent such effects and aberrations affect the angular subtense of the rays. Likewise, it is desirable to maintain a high degree of telecentricity so that the chief ray of the optical ray bundle incident at any point in the imaged illumination plane is substantially normal to the illumination plane. Preferably, the system is characterized by a deviation from the telecentric condition of less than 1% over the entire active area of the illumination plane.

Figure 19D:
Figure 19E:
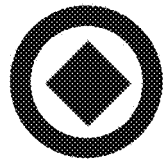
Figure 19H:
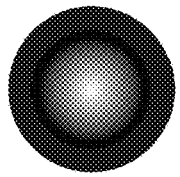
Figure 19F:
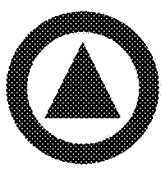
Figure 19I:
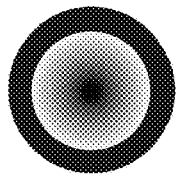
Figure 19J:
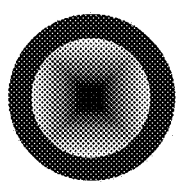

Although the apodized aperture stops described above have radially-varying reflectivity and circular symmetry, other apodized aperture stops may be used. With reference to FIGS. 19D and 19E, square central reflective apodized aperture stops having horizontal and 45° rotated squares, respectively, are shown. The resulting diffraction patterns have a cross shaped extended pattern perpendicular to the axes of the sides in a well-known pattern. The aperture function of FIG. 19F forms a symmetrically disposed star patterned diffraction pattern due to the three distinct angles of the sides. Other apodizing aperture patterns can be used. For example, FIG. 19G shows another such variation. The resulting diffraction patterns can be simulated by FFT and PSF characterization computational simulation tools readily available and known in the field of optical signal processing. The optimal choice of an apodizing aperture function to utilize is determined by the pattern geometry that is to be etched into the semiconductor substrate being patterned. Both positive and negative Gaussian functions represented by FIGS. 19H and 19I, or hybrid functions as shown in FIG. 19J, can result in advantageous resolution improving performance. It should be noted that there is a tradeoff between transmitted intensity that is incident at the illumination plane and the resolution enhancing effects of apodized aperture stops. With reference, for example, to the comparison in transmission between the apodized aperture stop of FIG. 19B and that of the fully open standard and non-apodized aperture stop of FIG. 19A, the total optical power transmitted is a function of the transmitted optical power to the blocked optical power. In the case of a system incorporating the reflective aperture technology of a preferred embodiment of the present invention, optical power that would otherwise be lost for a nonreflective aperture stop is partially returned by diffuse reflectance back from the surface of the LED die to enhance the intensity of the resulting image at the plane of illumination.

Figure 20:
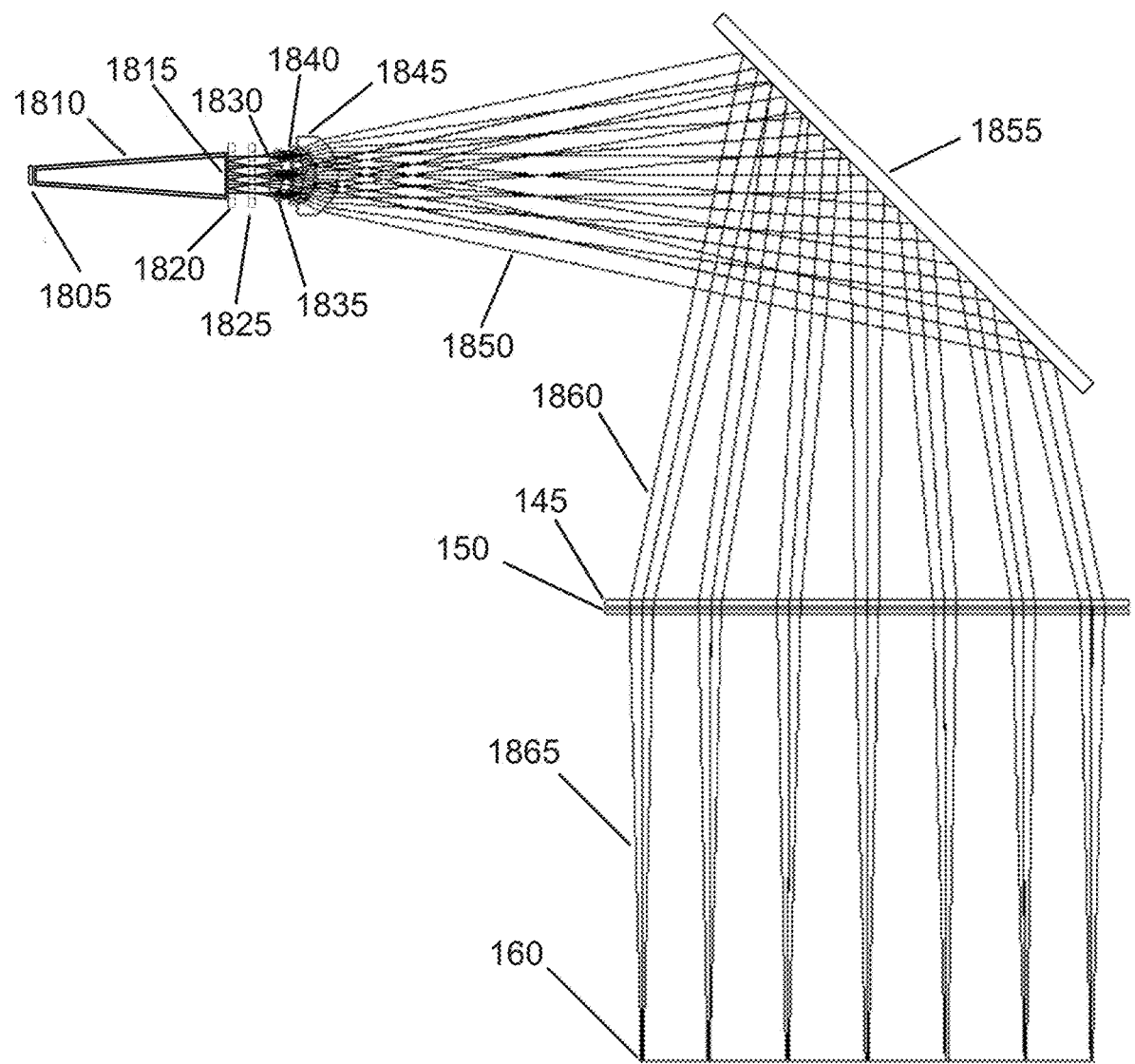
FIG. 20 shows a diagrammatic cross-sectional view of an alternative example to the telecentric illuminator of FIG. 1.
Figure 21:
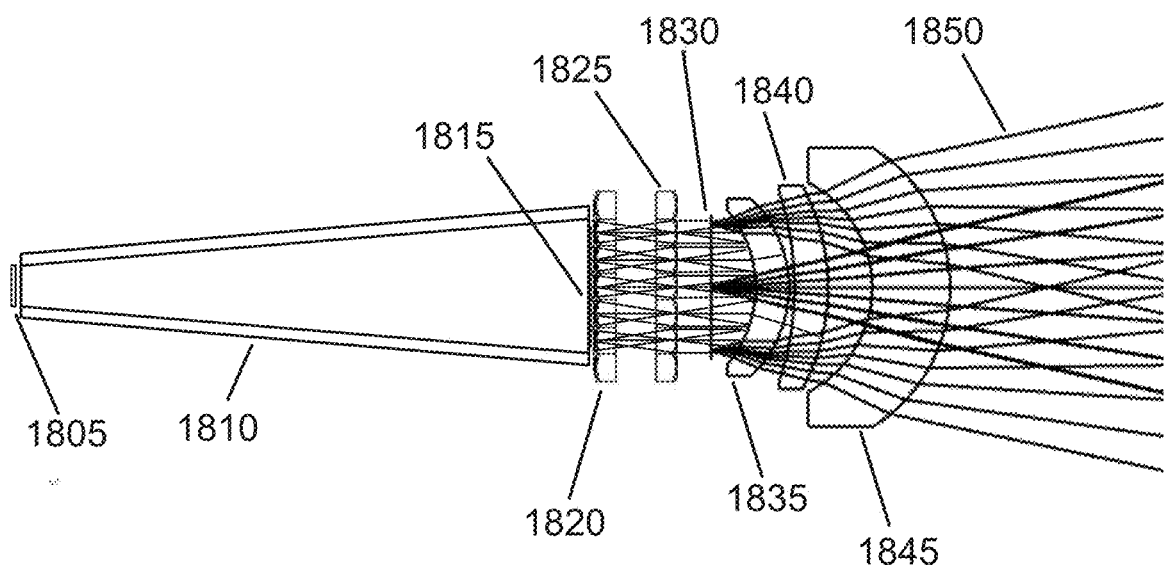
FIG. 21 shows a magnified diagrammatic cross-sectional view of the components of the telecentric illuminator of FIG. 20 upstream from the turning mirror.
Figure 22:
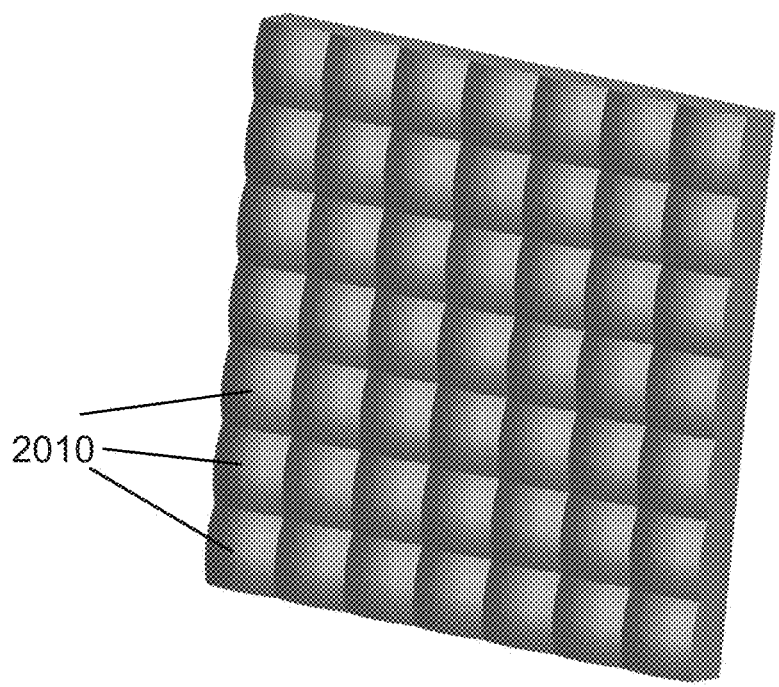
FIG. 22 shows an isometric view of one of the Fly's Eye microlens arrays shown in FIG. 21.

With reference now to FIG. 20, a diagrammatic cross-sectional view is shown of a UV Contact Exposure System for Mask Aligner application which incorporates a Kohler Fly's Eye illumination set of matching lens arrays. Such matched set lens arrays have been used extensively in projection systems and reduce intensity fluctuations across the image that otherwise occur using a non-uniform source such as a mercury arc lamp. Light from the LED die or die array 1805 is collected and homogenized in the near field by a hollow or solid glass tapered optic 1810 having an output aperture 1815 positioned close to a two-dimensional lens array 1820. FIG. 22 shows a detailed isometric view of the lens array 1820 of FIG. 21 showing individual lenses 2010 each having a square aperture. The lens arrays can have power on both sides of the dielectric array and the surface curvatures can include aspheric terms in additions to the spherical radius; however, in some applications, a standard spherical lens curvature may be formed on just one side of the array. Additionally, for embodiments where the lenses 2010 are plano-convex, facing the convex surface closer to the LED source and the flat side closer to the image plane with a second lens array positioned one focal length (for a given lens element) away from the first lens array, and positioning the output of the second lens array near or within a focal distance from the aperture stop 1830, the resulting image at the illumination plane 160 (see FIG. 1) corresponds to the shape of the individual lens elements in the Fly's Eye lens array. Thus, if a square intensity pattern at the illumination plane is desired, the shape of each lens in the array is square. The image at the illumination plane is the superposition of light transmitted through each lens aperture, which is why the input uniformity at the plane of the first microlens array is not critical due to a substantial averaging effect. The use of the tapered optic 1810 eliminates many components that are otherwise required for use of an imaging lens-based system to illuminate the microlens array which results in a more compact system. A disadvantage of the use of the microlens array Kohler Fly's Eye condensing is the lower radiance in the far field for a given number of LED die in comparison to the system of FIG. 1. Specifically, if there is no aperture stop 1830, the far field at the illumination plane is substantially square, thus the far field angles outside the confines of a circular far field have increased angular subtense, resulting in greater blur effect particularly in the case of proximity masks for which there is a finite gap on the order of microns to tens of microns between the mask and substrate. If a circular aperture stop is used, the intensity at the illumination plane is approximately 25% less than that for the system of FIG. 1. Thus, to achieve the smaller far field required to minimize geometric angular blur, it does not perform as well as the system of FIG. 1. The lens arrays can be made from similar materials as discussed above for other lenses, molded or cast optical components and can be AR coated to reduce or minimize Fresnel reflection losses to improve intensity at the illumination plane.

What is claimed is:

1. A telecentric illuminator comprising:
a tapered optic having an input aperture to receive light from a light emitting diode source and having an exit aperture;
a field stop disposed at the exit aperture of the tapered optic;
a lens group in optical communication with the exit aperture of the tapered optic, the lens group comprising a plurality of lenses and an aperture stop; and
a Fresnel lens in optical communication with the lens group,
wherein the tapered optic, the lens group and the Fresnel lens are arranged on an optical axis and wherein the Fresnel lens is positioned on the optical axis to generate a telecentric image of the field stop at an illumination plane.

2. The telecentric illuminator of claim 1, wherein the Fresnel lens comprises a curved central portion disposed about the optical axis and outer zones concentric with the optical axis.

3. The telecentric illuminator of claim 2, wherein each outer zone comprises a facet surface.

4. The telecentric illuminator of claim 2, wherein each outer zone comprises a curved surface.

5. The telecentric illuminator of claim 1, wherein the Fresnel lens is formed of an ultraviolet transmissive material.

6. The telecentric illuminator of claim 1, further comprising a protective window adjacent to the Fresnel lens.

7. The telecentric illuminator of claim 1, further comprising the light emitting diode source.

8. The telecentric illuminator of claim 7, wherein the light emitting diode source provides at least one of ultraviolet light and blue light.

9. The telecentric illuminator of claim 7, wherein the light emitting diode source provides light at wavelengths in the ultraviolet, visible and infrared spectral bands.

10. A telecentric illuminator comprising:
a tapered optic having an input aperture to receive light from a light emitting diode source and having an exit aperture;
a field stop disposed at the exit aperture of the tapered optic;
a lens group in optical communication with the exit aperture of the tapered optic, the lens group comprising a plurality of lenses and an apodized aperture stop; and
a Fresnel lens in optical communication with the lens group,
wherein the tapered optic, the lens group and the Fresnel lens are arranged on an optical axis, the Fresnel lens is positioned on the optical axis to generate a telecentric image of the field stop at an illumination plane.

11. The telecentric illuminator of claim 10, wherein the apodized aperture stop comprises a radially-varying reflectivity.

12. The telecentric illuminator of claim 10 wherein the apodized aperture stop comprises a central reflective region.

13. The telecentric illuminator of claim 12, wherein the central reflective region has a non-circularly symmetric shape.

14. The telecentric illuminator of claim 10 wherein the apodized aperture stop comprises a reflective annular region.

15. The telecentric illuminator of claim 10, wherein the Fresnel lens is formed of an ultraviolet transmissive material.

* * * * *